(12) United States Patent
Park et al.

(10) Patent No.: US 12,237,240 B2
(45) Date of Patent: Feb. 25, 2025

(54) SEMICONDUCTOR PACKAGE AND METHOD OF MANUFACTURING SEMICONDUCTOR PACKAGE

(71) Applicant: Samsung Electronics Co., Ltd., Suwon-si (KR)

(72) Inventors: Jinwoo Park, Seoul (KR); Jongho Lee, Hwaseong-si (KR); Yeongkwon Ko, Hwaseong-si (KR); Teakhoon Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 390 days.

(21) Appl. No.: 17/573,426

(22) Filed: Jan. 11, 2022

(65) Prior Publication Data
US 2022/0319944 A1 Oct. 6, 2022

(30) Foreign Application Priority Data
Mar. 30, 2021 (KR) .......................... 10-2021-0041139

(51) Int. Cl.
| | | |
|---|---|---|
| H01L 23/31 | (2006.01) | |
| H01L 21/56 | (2006.01) | |
| H01L 23/00 | (2006.01) | |
| H01L 23/498 | (2006.01) | |
| H01L 25/00 | (2006.01) | |
| H01L 25/065 | (2023.01) | |

(52) U.S. Cl.
CPC ........ *H01L 23/3185* (2013.01); *H01L 21/563* (2013.01); *H01L 21/565* (2013.01); *H01L 23/49827* (2013.01); *H01L 24/16* (2013.01); *H01L 24/73* (2013.01); *H01L 25/0655* (2013.01); *H01L 25/50* (2013.01); *H01L 24/32* (2013.01); *H01L 24/81* (2013.01); *H01L 24/83* (2013.01); *H01L 2224/16227* (2013.01); *H01L 2224/32225* (2013.01); *H01L 2224/73204* (2013.01); *H01L 2224/83855* (2013.01); *H01L 2924/3511* (2013.01)

(58) Field of Classification Search
CPC ..... H01L 21/563; H01L 21/565; H01L 24/16; H01L 23/3185
See application file for complete search history.

(56) References Cited

U.S. PATENT DOCUMENTS

| | | | |
|---|---|---|---|
| 8,716,830 B2 * | 5/2014 | Poddar | ................ H01L 23/4334 257/E21.573 |
| 9,656,856 B2 | 5/2017 | Jiang et al. | |
| 10,553,457 B2 | 2/2020 | Isobe | |
| 10,784,230 B2 | 9/2020 | Chen | |
| 10,840,215 B2 | 11/2020 | Lu et al. | |

(Continued)

*Primary Examiner* — Errol V Fernandes
(74) *Attorney, Agent, or Firm* — Muir Patent Law, PLLC

(57) ABSTRACT

A semiconductor package includes a package substrate, an interposer provided on the package substrate, a plurality of semiconductor devices on the interposer to be spaced apart from each other, the semiconductor devices being electrically connected to the package substrate through the interposer, and a molding layer on the interposer covering the semiconductor devices and exposing upper surfaces of the semiconductor devices, the molding layer including at least one groove extending in one direction between the semiconductor devices, the groove having a predetermined depth from an upper surface of the molding layer.

18 Claims, 29 Drawing Sheets

(56) References Cited

U.S. PATENT DOCUMENTS

| | | | |
|---|---|---|---|
| 2011/0221053 A1 | 9/2011 | Chandrasekaran et al. | |
| 2015/0371969 A1* | 12/2015 | Yu | H01L 23/562 |
| | | | 438/106 |
| 2017/0213809 A1* | 7/2017 | Lu | H01L 24/97 |
| 2020/0343197 A1 | 10/2020 | Chen et al. | |
| 2022/0068881 A1* | 3/2022 | Jang | H01L 24/32 |

* cited by examiner

SEMICONDUCTOR PACKAGE AND METHOD OF MANUFACTURING SEMICONDUCTOR PACKAGE

PRIORITY STATEMENT

This application claims priority under 35 U.S.C. § 119 to Korean Patent Application No. 10-2021-0041139, filed on Mar. 30, 2021 in the Korean Intellectual Property Office (KIPO), the contents of which are herein incorporated by reference in their entirety.

BACKGROUND

1. Field

Example embodiments relate to a semiconductor package and a method of manufacturing the semiconductor package. More particularly, example embodiments relate to a semiconductor package including a plurality of different chips stacked on a package substrate using an interposer and a method of manufacturing the same.

2. Description of the Related Art 2.5D package products may provide high-density interconnection using an extra substrate such as a silicon interposer. Different types of semiconductor devices may be disposed on the silicon interposer and then molded by a molding material. However, warpage occurs due to a difference in coefficients of thermal expansion between individual components constituting the molded interposer, and thus, when the molded interposer is bonded to a package substrate, bending behaviors of the components in a high temperature section do not match with each other, so that there is a problem in that wettability is poor (non-wetting phenomenon).

SUMMARY

Example embodiments provide a semiconductor package including a structure capable of improving reliability of the semiconductor package.

Example embodiments provide a method of manufacturing the semiconductor package.

According to example embodiments, a semiconductor package includes a package substrate, an interposer provided on the package substrate, a plurality of semiconductor devices on the interposer to be spaced apart from each other, the semiconductor devices being electrically connected to the package substrate through the interposer, and a molding layer on the interposer covering the semiconductor devices and exposing upper surfaces of the semiconductor devices, the molding layer including at least one groove extending in one direction between the semiconductor devices, the groove having a predetermined depth from an upper surface of the molding layer.

According to example embodiments, a semiconductor package includes a package substrate, an interposer arranged on the package substrate, the interposer having a rectangular plate shape having a long side and a short side, two first semiconductor devices on the interposer and being spaced apart from each other in a first direction parallel with an extending direction of the long side with a center line interposed therebetween, wherein the center line passes through midpoints of the long sides of the rectangular plate shape, eight second semiconductor devices arranged on the interposer and at both sides of the two first semiconductor devices, the second semiconductor devices being spaced apart from each other in the first direction, and a molding layer on the interposer covering the first and second semiconductor devices. The molding layer includes a first groove extending in a second direction perpendicular to the first direction between the first semiconductor devices and a second groove extending in the second direction between the second semiconductor devices that are spaced apart from each other with the center line interposed therebetween. The first and second grooves having predetermined depths from an upper surface of the molding layer.

According to example embodiments, a semiconductor package includes a package substrate, an interposer arranged on the package substrate, the interposer having a rectangular plate shape having a first side and a second side, first semiconductor devices disposed on the interposer and being spaced apart from each other in a first direction parallel with an extending direction of the first side, second semiconductor devices disposed on the interposer and being arranged at both sides of the first semiconductor devices, the second semiconductor devices being spaced apart from each other in the first direction, and a molding layer on the interposer covering the first and second semiconductor devices and exposing upper surfaces of the first and second semiconductor devices. The molding layer includes a first groove extending in a second direction perpendicular to the first direction between the first semiconductor devices that are spaced apart from each other with a center line interposed therebetween, the center line passing through midpoints of first sides of the rectangular plate shape, and a second groove extending in the second direction between the second semiconductor devices that are spaced apart from each other with the center line interposed therebetween, the first and second grooves having predetermined depths from an upper surface of the molding layer. The first semiconductor devices are spaced apart from each other in the first direction by a distance in a range of 20 µm to 100 µm, and the second semiconductor devices are spaced apart from each other in the first direction by a distance in a range of 50 µm to 150 µm.

According to example embodiments, a semiconductor package may include a package substrate, an interposer provided on the package substrate, first and second semiconductor devices arranged on the interposer to be spaced apart from each other, and a molding layer on the interposer to cover side surfaces of the first and second semiconductor devices. The molding layer may have at least one groove extending in one direction between the first and second semiconductor devices. The molding layer may have a coefficient of thermal expansion greater than those of the first and second semiconductor devices.

Since the groove is formed in an upper surface of the molding layer between the first and second semiconductor devices, warpage behavior of the molded interposer in a high temperature region may be minimized and the rigidity of the molded interposer may be reduced. Accordingly, solder wettability in a bonding process of the molded interposer may be improved to enhance 2.5D package reliability. Further, a thermal disconnection effect between the first and second semiconductor devices may be generated to thereby prevent a thermal-coupling phenomenon.

BRIEF DESCRIPTION OF THE DRAWINGS

Example embodiments will be more clearly understood from the following detailed description taken in conjunction with the accompanying drawings.

FIG. 1 is a plan view illustrating a semiconductor package according to example embodiments.

FIG. 2 is a cross-sectional view taken along the line A-A' in FIG. 1.

FIG. 3 is a cross-sectional view taken along the line B-B' in FIG. 1.

FIG. 4 is an enlarged cross-sectional view illustrating portion 'C' in FIG. 2.

FIG. 5 is an enlarged cross-sectional view illustrating portion 'D' in FIG. 3.

FIGS. 6 to 20 are views illustrating a method of manufacturing a semiconductor package according to example embodiments.

FIG. 21 is a cross-sectional view illustrating a portion of a semiconductor package according to example embodiments.

FIG. 22 is a cross-sectional view illustrating a portion of a semiconductor package according to example embodiments.

FIG. 23 is a plan view illustrating a semiconductor package according to example embodiments.

FIG. 24 is a plan view illustrating a semiconductor package according to example embodiments.

FIG. 25 is a cross-sectional view taken along the line G-G' in FIG. 24.

FIGS. 26 to 29 are cross-sectional views illustrating a method of manufacturing a semiconductor package according to example embodiments.

FIG. 30 is a cross-sectional view illustrating a portion of a semiconductor package according to example embodiments.

FIG. 31 is a cross-sectional view illustrating a portion of a semiconductor package according to example embodiments.

FIG. 32 is a plan view illustrating a semiconductor package according to example embodiments.

DETAILED DESCRIPTION OF EXAMPLE EMBODIMENTS

Hereinafter, example embodiments will be explained in detail with reference to the accompanying drawings.

Figure 1:
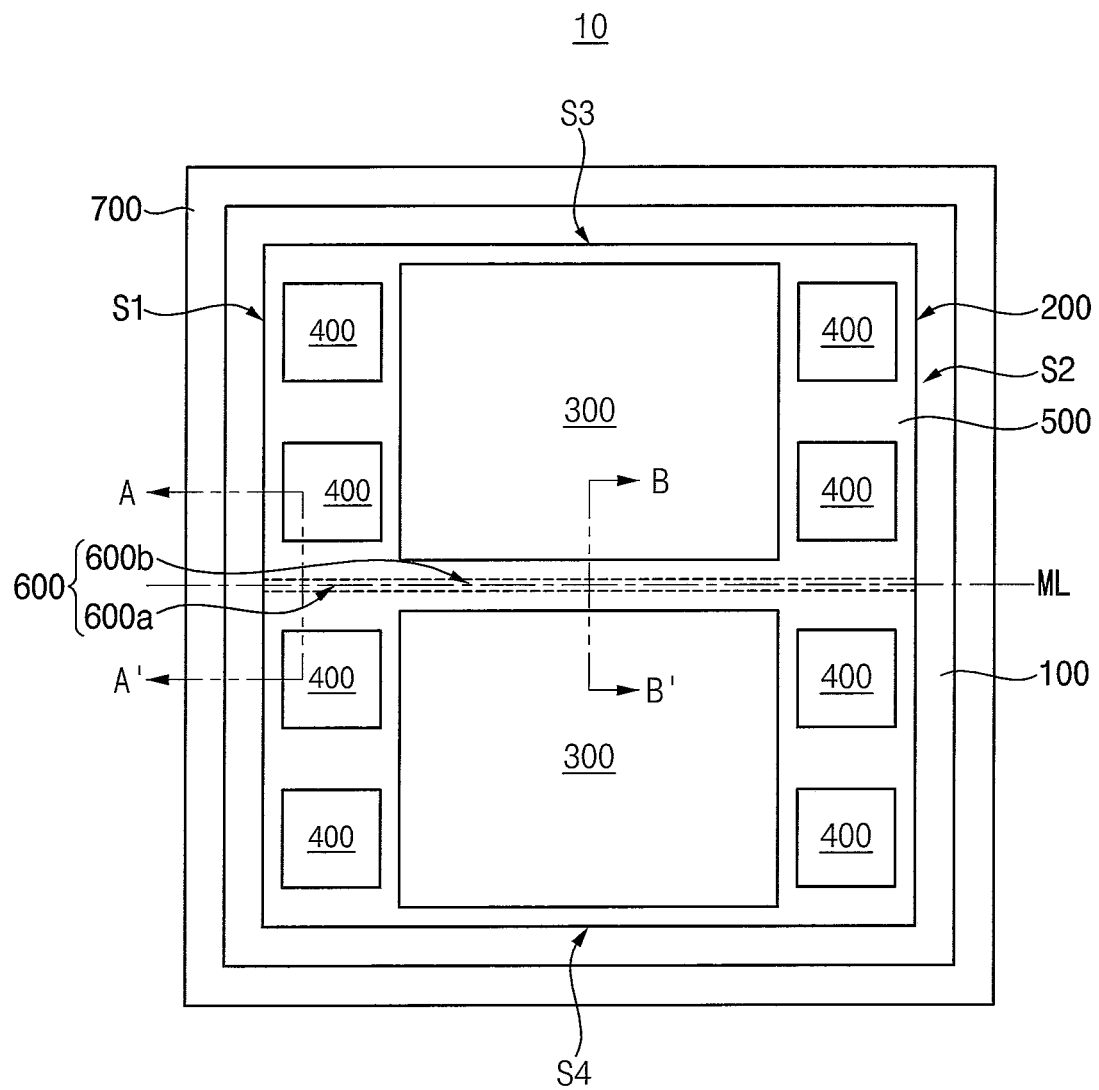
FIGS. 1 to 32 represent non-limiting, example embodiments as described herein.
Figure 2:
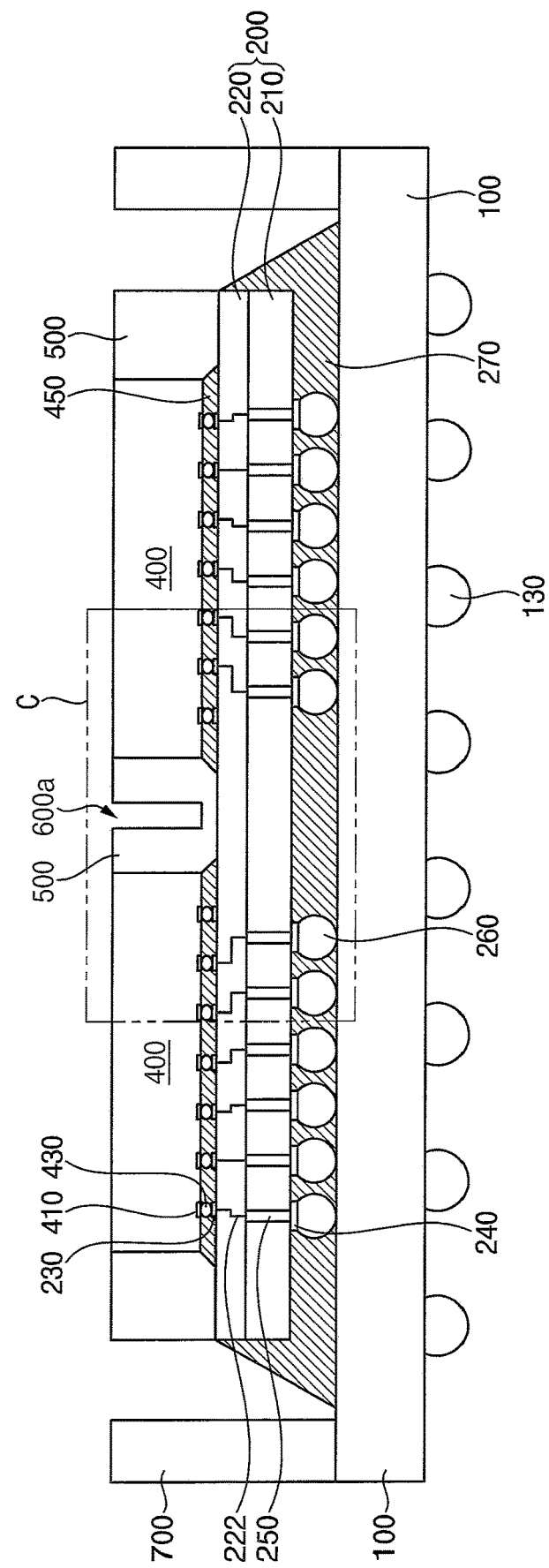
Figure 3:
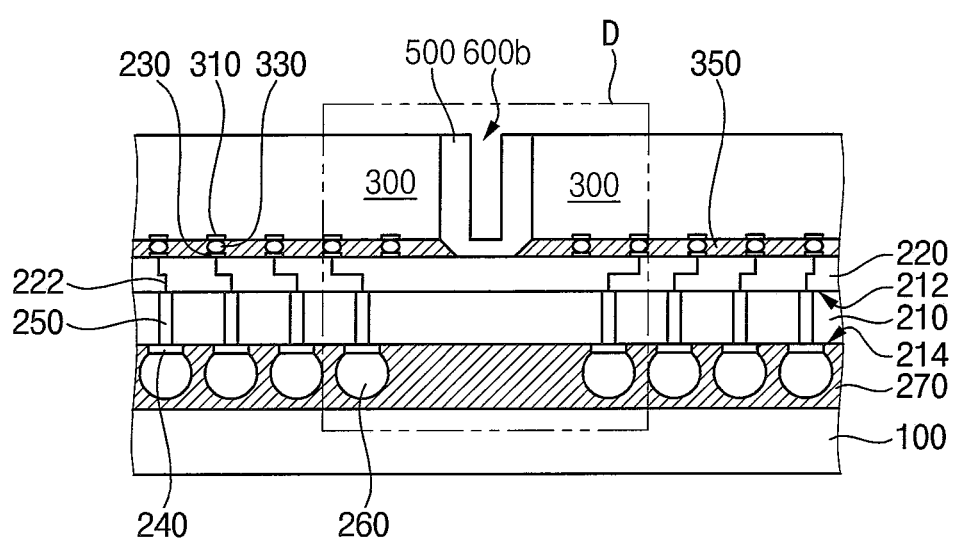
Figure 4:
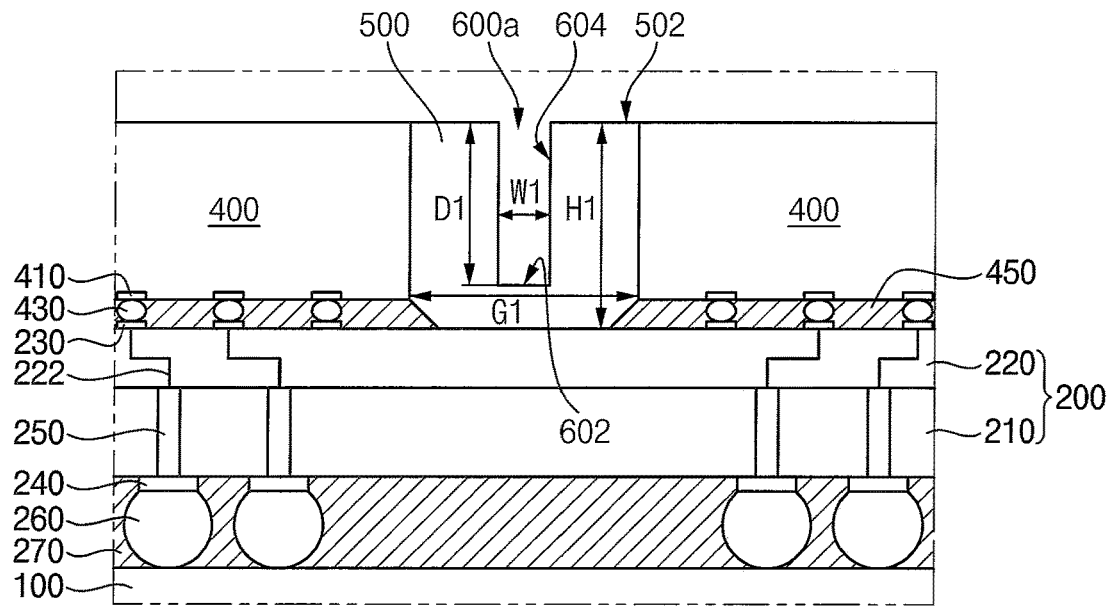
Figure 5:
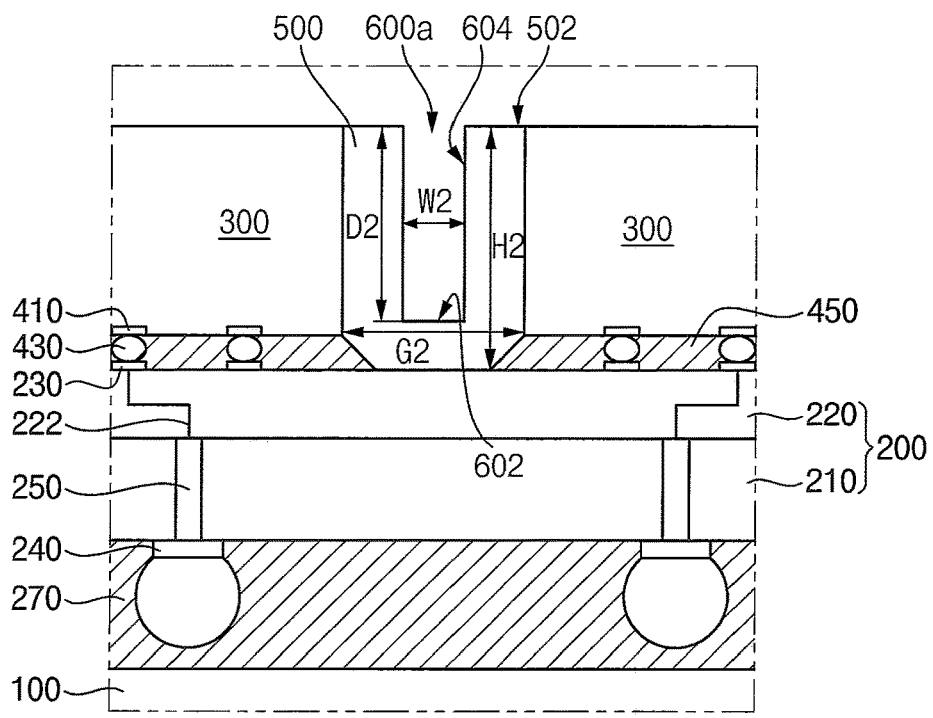

FIG. 1 is a plan view illustrating a semiconductor package according to example embodiments. FIG. 2 is a cross-sectional view taken along the line A-A' in FIG. 1. FIG. 3 is a cross-sectional view taken along the line B-B' in FIG. 1. FIG. 4 is an enlarged cross-sectional view illustrating portion 'C' in FIG. 2. FIG. 5 is an enlarged cross-sectional view illustrating portion 'D' in FIG. 3.

Referring to FIGS. 1 to 5, a semiconductor package 10 may include a package substrate 100, an interposer 200, first and second semiconductor devices 300 and 400, and a molding layer 500. Additionally, the semiconductor package 10 may further include a first underfill member 350, a second underfill member 450 and a third underfill member 270 and a stiffener 700.

In example embodiments, the semiconductor package 10 may be a memory device having a stacked chip structure in which a plurality of dies (chips) is stacked. For example, the semiconductor package 10 may include a semiconductor memory device with a 2.5D chip structure. In this case, a first semiconductor device 300 may include or may be a logic semiconductor device, and a second semiconductor device 400 may include or may be a memory device. The logic semiconductor device may include or may be a CPU, a GPU, an ASIC, or an SOC. The memory device may include or may be a high bandwidth memory (HBM) device.

In example embodiments, the package substrate 100 may be a substrate having an upper surface and a lower surface opposite to each other. For example, the package substrate 100 may be a printed circuit board (PCB). The PCB may be a multilayered circuit board including vias and various circuits therein.

The interposer 200 may be disposed on the package substrate 100. The interposer 200 may be mounted on the package substrate 100 through solder bumps 260. A planar area of the interposer 200 may be less than a planar area of the package substrate 100. For example, the planar area of the interposer 200 may be an area of the interposer 200 in a plan view. The interposer 200 may be disposed within the area of the package substrate 100 in a plan view. For example, the package substrate 100 may vertically overlap the whole interposer 200.

The interposer 200 may be a silicon interposer including a plurality of wirings therein. First semiconductor devices 300 and second semiconductor devices 400 may be electrically connected to each other through the wirings and may be electrically connected to the package substrate 100 through the solder bumps 260. The silicon interposer may provide a high density interconnection between the first and second semiconductor devices 300 and 400. Alternatively, the interposer 200 may be a redistribution wiring interposer or a semiconductor die in which a logic chip or a memory chip is implemented.

As used herein, components described as being "electrically connected" are configured such that an electrical signal can be transferred from one component to the other (although such electrical signal may be attenuated in strength as it transferred and may be selectively transferred).

In case of the silicon interposer, the interposer 200 may include a semiconductor substrate 210, a wiring layer 220 disposed on an upper surface of the semiconductor substrate 210 and including a plurality of wirings 222, a plurality of first bonding pads 230 provided on the wiring layer 220 and a plurality of second bonding pads 240 provided on a lower surface of the semiconductor substrate 210.

For example, the interposer 200 may have an area of 20 mm×30 mm or more. For example, the interposer 200 may have a rectangle shape in a plan view. For example, lengths of shorter sides of the interposer 200 may be 20 mm or greater and lengths of longer sides of the interposer 200 may be 30 mm or greater in the plan view. The substrate 210 may include silicon, germanium, silicon-germanium, or III-V compounds, e.g., GaP, GaAs, GaSb, etc.

The wiring layer 220 may include a plurality of insulation layers and a plurality of wirings 222 in the insulation layers. For example, the wirings 222 may include or be formed of a metal such as copper Cu.

The semiconductor substrate 210 may include a plurality of through electrodes 250 penetrating therethrough. The through electrodes 250 may include a through silicon via (TSV). Each of the through electrodes 250 may be provided to extend in a thickness direction from a first surface of the semiconductor substrate 210 to a second surface of the semiconductor substrate 210. The first and second surfaces of the semiconductor substrate 210 may be opposite surfaces. An end portion of the through electrode 250 may contact the wiring 222 of the wiring layer 220.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The interposer 200 may be mounted on the package substrate 100 via the solder bumps 260. Each of the solder bumps 260 may be formed on a corresponding second bonding pad 240. For example, the solder bump 260 may include or may be C4 (controlled collapse chip connection) bump. The second bonding pad 240 of the interposer 200 may be electrically connected to a substrate pad of the package substrate 100 by the solder bump 260.

In example embodiments, at least one first semiconductor device 300 may be arranged on the interposer 200. The first semiconductor device 300 may be mounted on the interposer 200 in a flip chip bonding manner. In this case, the first semiconductor device 300 may be mounted such that an active surface of the first semiconductor device 300 on which chip pads 310 are formed faces the interposer 200. The chip pads 310 of the first semiconductor device 300 may be electrically connected to the first bonding pads 230 of the interposer 200 by conductive bumps 330. For example, the conductive bumps 330 may include or may be micro bumps (uBump).

The second semiconductor devices 400 may be arranged on the interposer 200 to be spaced apart from the first semiconductor device 300. The second semiconductor devices 400 may be arranged on the interposer 200 to be spaced apart from each other. The second semiconductor devices 400 may be mounted on the interposer 200 in a flip chip bonding manner. In this case, each of the second semiconductor devices 400 may be mounted such that an active surface of the second semiconductor device 400 on which chip pads 410 are formed faces the interposer 200. The chip pads 410 of the second semiconductor device 400 may be electrically connected to the first bonding pads 230 of the interposer 200 by conductive bumps 430. For example, the conductive bumps 430 may include or may be micro bumps (uBump).

For example, the second semiconductor device 400 may include a buffer die and a plurality of memory dies (chips) sequentially stacked on the buffer die. Additionally, the second semiconductor device 400 may further include a molding member covering at least side surfaces of the buffer die and the memory dies. The buffer die and the memory dies may be electrically connected to each other by through silicon vias (TSVs).

The wirings 222 may be electrically connected to through electrodes 250. The first and second semiconductor devices 300, 400 may be electrically connected to the package substrate 100 through the wirings 222 and the through electrodes 250. The first semiconductor device 300 and the second semiconductor device 400 may be electrically connected to each other by the wirings 222.

In example embodiments, the first underfill member 350 may be filled between the first semiconductor device 300 and the interposer 200 and the second underfill member 450 may be filled between the second semiconductor device 400 and the interposer 200. The third underfill member 270 may be filled between the interposer 200 and the package substrate 100.

The first underfill member 350 may extend between the first semiconductor device 300 and the interposer 200 to reinforce a gap between the first semiconductor device 300 and the interposer 200. For example, the first underfill member 350 may reinforce adhesion between the first semiconductor device 300 and the interposer 200. The second underfill member 450 may extend between the second semiconductor device 400 and the interposer 200 to reinforce a gap between the second semiconductor device 400 and the interposer 200. For example, the second underfill member 450 may reinforce adhesion between the second semiconductor device 400 and the interposer 200. Portions of the first and second underfill members 350 and 450 may extend upwardly from the upper surface of the interposer 200 respectively to cover portions of side surfaces of the first and second semiconductor devices 350 and 450 to firmly support the first and second semiconductor devices 350 and 450.

The third underfill member 270 may extend between the interposer 200 and the package substrate 100 to reinforce a gap between the interposer 200 and the package substrate 100. For example, the third underfill member 270 may reinforce adhesion between the interposer 200 and the package substrate 100. A portion of the third underfill member 270 may extend upwardly from the upper surface of the package substrate 100 to cover a portion of a side surface of the interposer 200 to firmly support the interposer 200.

The first, second and third underfill members 350, 450 and 270 may include or be formed of a material having a relatively high fluidity to effectively fill small spaces between the first and second semiconductor devices 300 and 400 and the interposer 200 and between the interposer 200 and the package substrate 100. For example, the first, second and third underfill members 350, 450 and 270 may include or be formed of an adhesive including an epoxy material. The first and second semiconductor devices 300 and 400 may have a first coefficient of thermal expansion, and the first and second underfill members 350 and 450 may have a second coefficient of thermal expansion greater than the first coefficient of thermal expansion. The first coefficient of thermal expansion may be within a range of 1 ppm/° C. to 4 ppm/° C., and the second coefficient of thermal expansion may be within a range of 20 ppm/° C. to 30 ppm/° C.

As illustrated in FIG. 1, the interposer 200 may include first to fourth side surfaces S1, S2, S3 and S4. The first to fourth side surfaces S1, S2, S3 and S4 may be perpendicular to the upper surface of the interposer 200. The third side surface S3 and the fourth side surface S4 may extend in parallel with a first direction (X direction) and may be opposite to each other. The first side surface S1 and a second side surface S2 may extend in a direction parallel with a second direction (Y direction) and may be opposite to each other. The first direction (X-direction) and the second direction (Y direction) may be perpendicular to each other. The interposer 200 may have a rectangular plate shape having long sides (e.g., the first and second sides S1 and S2) and short sides (e.g., the second and fourth sides S3 and S4).

The first and second semiconductor devices 300 and 400 may be arranged on the upper surface of the interposer 200 to be spaced apart from each other. Two first semiconductor devices 300 may be arranged to be spaced apart from each other in the second direction (Y direction) with a center line ML of the interposer 200 interposed therebetween, e.g., in a plan view. The center line ML may pass through the midpoints of the long sides. Four second semiconductor devices 400 may be disposed on the upper surface of the interposer 200 to be spaced apart from each other in the second direction (Y direction) along the first side surface S1 of the interposer 200. Four second semiconductor devices 400 may be disposed on the upper surface of the interposer 200 to be spaced apart from each other in the second direction (Y direction) along the second side surface S2 of the interposer 200. Two second semiconductor devices 400 may be disposed to be spaced apart from each other in the second direction (Y direction) with the center line ML of the interposer 200 interposed therebetween, e.g., in a plan view.

In a plan view as shown in FIG. 1, two second semiconductor devices 400 may be arranged on the left side of a first semiconductor device 300 above the center line ML adjacent to the first side surface S1 of the interposer 200, and two second semiconductor devices 400 may be arranged on the right side of the first semiconductor device 300 above the center line ML adjacent to the second side surface S2 of the interposer 200. Similarly, two second semiconductor devices 400 may be arranged on the left side of a first semiconductor device 300 below the center line ML adjacent to the first side surface S1 of the interposer 200, and two second semiconductor devices 400 may be arranged on the right side of the first semiconductor device 300 below the center line ML adjacent to the second side surface S2 of the interposer 200.

Although only two first semiconductor devices 300 and eight second semiconductor devices 400 are illustrated in the figures, the numbers and arrangements thereof are exemplary, and they are not limited thereto.

As illustrated in FIGS. 2 and 4, the second semiconductor devices 400 may be spaced apart from each other in the second direction (Y direction) to form a first gap G1. For example, the first gap G1 may have a spacing distance in a range of 50 μm to 150 μm. A first height H1 of the second semiconductor device 400, e.g., a vertical distance from a top surface of the interposer 200 to a top surface of the second semiconductor device 400, may be 700 μm or more. For example, the vertical distance may be measured in a direction perpendicular to the top surface of the interposer 200. The second semiconductor device 400 may have an area of 10 mm×10 mm or more, e.g., in a plan view. For example, each side of the second semiconductor device 400 may have a length of 10 mm or greater in the plan view.

As illustrated in FIGS. 3 and 5, the first semiconductor devices 300 may be spaced apart from each other in the second direction (Y direction) to form a second gap G2. The second gap G2 may have a spacing distance less than the spacing distance of the first gap G1. For example, the second gap G2 may have the spacing distance within a range of 20 μm to 100 μm. The first semiconductor device 300 may have a second height H2 less than or the same as the height H1 of the second semiconductor device 400. The second height H2 may be a vertical distance from the top surface of the interposer 200 to a top surface of the semiconductor device 300. The second height H2 of the first semiconductor device 300 may be 500 μm or more. The first semiconductor device 300 may have an area of 20 mm×20 mm or more, e.g., in a plan view. For example, each side of the first semiconductor device 300 may have a length of 20 mm or greater in the plan view.

In example embodiments, the molding layer 500 may be provided on the upper surface of the interposer 200 to cover the first and second semiconductor devices 300 and 400. The molding layer 500 may cover the side surfaces of the first and second semiconductor devices 300 and 400.

An upper surface of the molding layer 500 may be coplanar with upper surfaces of the first semiconductor devices 300. The upper surface of the molding layer 500 may be coplanar with upper surfaces of the second semiconductor devices 400. The upper surfaces of the first and second semiconductor devices 300 and 400 may be exposed by the molding layer 500. A side surface of the molding layer 500 may be coplanar with the side surface of the interposer 200. A portion of the third underfill member 270 may cover at least a portion of the side surface of the molding layer 500.

For example, the molding layer 500 may include or be formed of a polymer material such as an epoxy molding compound (EMC). The molding layer 500 may have a coefficient of thermal expansion greater than those of the first and second semiconductor devices. The molding layer 500 may have a coefficient of thermal expansion within a range of 5 ppm/° C. to 15 ppm/° C. The interposer 200 may have a coefficient of thermal expansion the same as or similar to those of the first and second semiconductor devices 300 and 400.

In example embodiments, the molding layer 500 may have at least one groove 600 extending in one direction between the first and second semiconductor devices 300 and 400. A first groove 600a may be provided in the molding layer 500 between the second semiconductor devices 400. A second groove 600b may be provided in the molding layer 500 between the first semiconductor devices 300. In some embodiments, the first groove 600a and the second groove 600b may be integrally formed as shown in FIG. 1. For example, the first groove 600a and the second groove 600b may be connected to each other. For example, the first groove 600a and the second groove 600b may be continuously and integrally formed in the molding layer 500. In certain embodiments, the first groove 600a and the second groove 600b may be spaced apart from each other. The grooves 600a and 600b may be recesses formed on a top surface of the molding layer 500.

The first groove 600a may extend in the first direction (X direction) between the second semiconductor devices 400. The first groove 600a may extend along the center line ML of the interposer 200. The first groove 600a may have a first depth D1 from the upper surface 502 of the molding layer 500. For example, the first depth D1 of the first groove 600a may be 30% to 100% of the first height H1 of the second semiconductor device 400. The first width W1 of the first groove 600a may be 20% to 100% of the first gap G1.

When the first depth D1 of the first groove 600a is equal to the first height H1 of the second semiconductor device 400 (100% of the first height H1), the wiring layer 220 of the interposer 200 may be exposed on a bottom surface 602 the first groove 600a. When the first width W1 of the first groove 600a is equal to the spacing distance of the first gap G1 (100% of the first gap G1), the side surfaces of the second semiconductor devices 400 may be exposed on sidewalls 604 of the first groove 600a.

The second groove 600b may extend in the first direction (X direction) between the first semiconductor devices 300. The second groove 600b may extend along the center line ML of the interposer 200. The first and second grooves 600a and 600b may extend along the center line ML of the interposer 200 to be in communication with each other. The second groove 600b may have a second depth D2 from the upper surface 502 of the molding layer 500, e.g., in a vertical direction. For example, the second depth D2 of the second groove 600b may be 30% to 100% of the second height H2 of the first semiconductor device 300. The second width W2 of the second groove 600b may be 20% to 100% of the second gap G2. The second width W2 of the second groove 600b may be equal to or smaller than the first width W1 of the first groove 600a.

When the second depth D2 of the second groove 600b is equal to the second height H2 of the first semiconductor device 300 (100% of the second height H2), the wiring layer 220 of the interposer 200 may be exposed on a bottom surface 602 of the second groove 600b. When the second width W2 of the second groove 600b is equal to the spacing distance of the second gap G2 (100% of the second gap G2), the side surfaces of the first semiconductor devices 300 may be exposed on sidewalls 604 of the second groove 600b.

In example embodiments, a stiffener 700 may be arranged on the package substrate 100 to surround the semiconductor devices 300 and 400. The stiffener 700 may be provided to extend along a peripheral region of the package substrate 100 to increase overall rigidity of the package substrate 100 to thereby reduce or prevent warpage. Accordingly, reliability of the 2.5D package may be improved.

Outer connection pads may be formed on the lower surface of the package substrate 100, and outer connection members 130 for an electrical connection with an external device may be disposed on the outer connection pads respectively. The outer connection members 130 may be, for example, solder balls. The semiconductor package 10 may be mounted on a module substrate by the solder balls, thus constituting a memory module.

Although only some first bonding pads 230 and second bonding pads 240 are illustrated in the figures, it may be understood that the first bonding pads 230 and the second bonding pads 240 are exemplary, and thus, numbers and arrangements of the first and second bonding pads 230 and 240 are not limited thereto.

As mentioned above, the semiconductor package 10 may include the package substrate 100, the interposer 200 provided on the package substrate 100, the first and second semiconductor devices 300 and 400 arranged on the interposer 200 to be spaced apart from each other, and the molding layer 500 on the interposer 200 to cover the side surfaces of the first and second semiconductor devices 300 and 400. The molding layer 500 may have the at least one groove 600 extending in one direction between the first and second semiconductor devices 300 and 400. The molding layer 500 may have the coefficient of thermal expansion greater than those of the first and second semiconductor devices 300 and 400.

Since the groove 600 is formed in the upper surface of the molding layer 500 between the first and second semiconductor devices 300 and 400, warpage behavior of the molded interposer in a high temperature region may be minimized and the rigidity of the molded interposer may be reduced. Accordingly, solder wettability in a bonding process of the molded interposer may be improved to enhance the 2.5D package reliability. Further, a thermal disconnection effect between the first and second semiconductor devices 300 and 400 may be generated to thereby prevent a thermal-coupling phenomenon.

Hereinafter, a method of manufacturing the semiconductor package in FIG. 1 will be explained.

FIGS. 6 to 20 are views illustrating a method of manufacturing a semiconductor package according to example embodiments. FIGS. 7 to 11, 13, 15, 17, 19 and 20 are cross-sectional views taken along the line E-E' in FIG. 6. FIGS. 12, 14, 16 and 18 are cross-sectional views taken along the line F-F' in FIG. 6.

Figure 6:
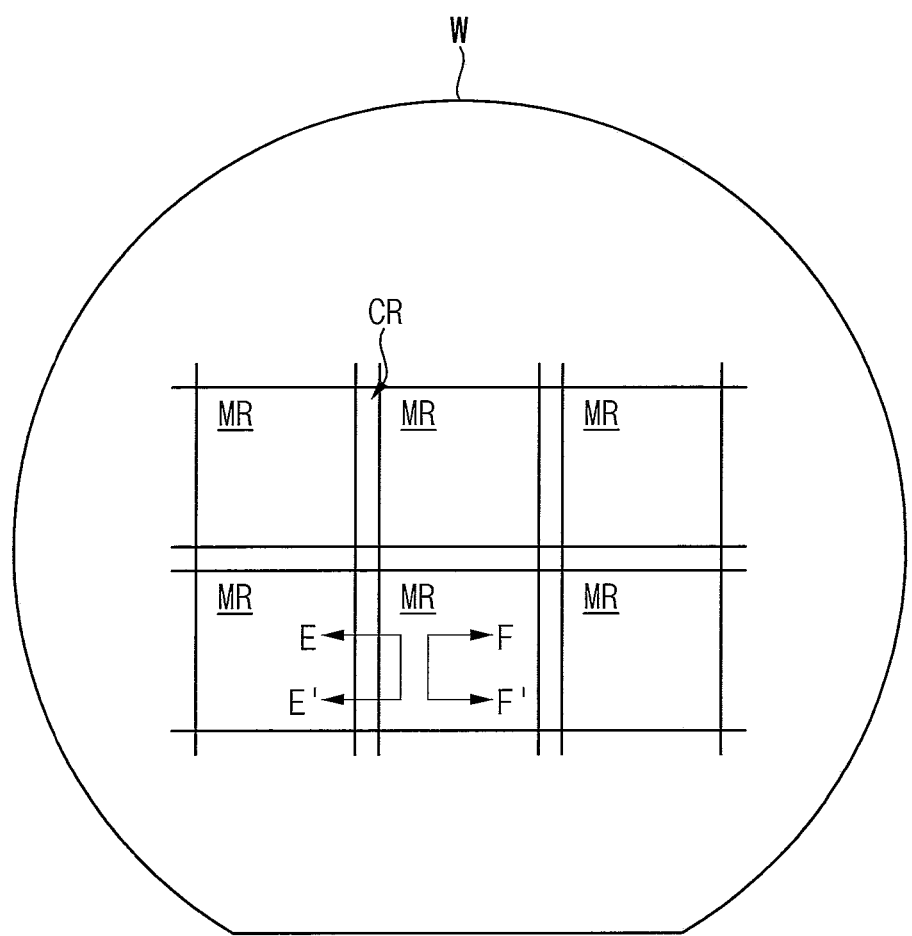
Figure 7:
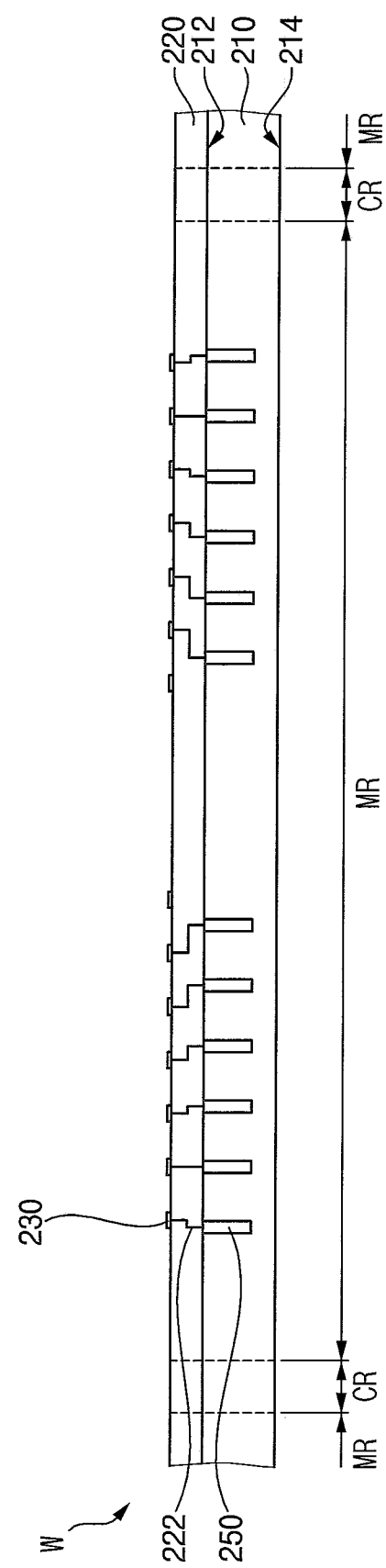

Referring to FIGS. 6 and 7, first, a semiconductor wafer W for a base structure may be prepared.

In example embodiments, the base structure may include or may be a silicon interposer. Alternatively, the base structure may include or may be a redistribution wiring interposer or a semiconductor die in which a logic chip or a memory chip is implemented.

In case of the silicon interposer, the wafer W may include a substrate 210 and a wiring layer 220. The wiring layer 220 may be provided on a first surface 212 of the substrate 210.

The wafer W may include a package region, e.g., a mounting region MR where semiconductor device(s) are mounted and a scribe lane region, e.g., a cutting region CA surrounding the mounting region MR. As described later, the wafer W may be cut along the cutting region CA dividing the mounting regions MR to form an individual interposer. For example, the mounting region MR may have an area of 20 mm×30 mm or more. For example, the mounting region MR may have a rectangle shape in a plan view. For example, shorter sides of the mounting region MR may have a length of 20 mm or greater, and longer sides of the mounting region MR may have a length of 30 mm or greater in the plan view.

For example, the substrate 210 may include or be formed of silicon, germanium, silicon-germanium, or III-V compounds, e.g., GaP, GaAs, GaSb, etc. In some embodiments, the substrate 210 may be a silicon-on-insulator (SOI) substrate, or a germanium-on-insulator (GOI) substrate.

The wiring layer 220 may be formed on the first surface 212 of the substrate 210. The wiring layer 220 may be formed by a back process referred to as BEOL (Back End of Line) process. The wiring layer 220 may include a plurality of insulation layers and a plurality of wirings 222 in the insulation layers. For example, the wiring may include or be formed of a metal such as copper (Cu).

The substrate 210 may include a plurality of through electrodes (through silicon vias) 250 which are formed to penetrate the substrate 210, e.g., from a top surface to a bottom surface of the substrate 210. The through electrodes 250 may be electrically connected to the wirings 222 respectively. The through electrodes 250 may be formed in the substrate 210 before grinding a backside (e.g., a second surface 214) of the substrate 210 (e.g., a via first process or a via middle process). Alternatively, the through electrode may be formed in the substrate 210 after grinding the backside of the substrate 210 (e.g., a via last process).

A first bonding pad 230 may be provided in the outermost insulation layer of the wiring layer 220. The through electrode 250 may be electrically connected to the first bonding pad 230 through the wiring 222.

Figure 8:
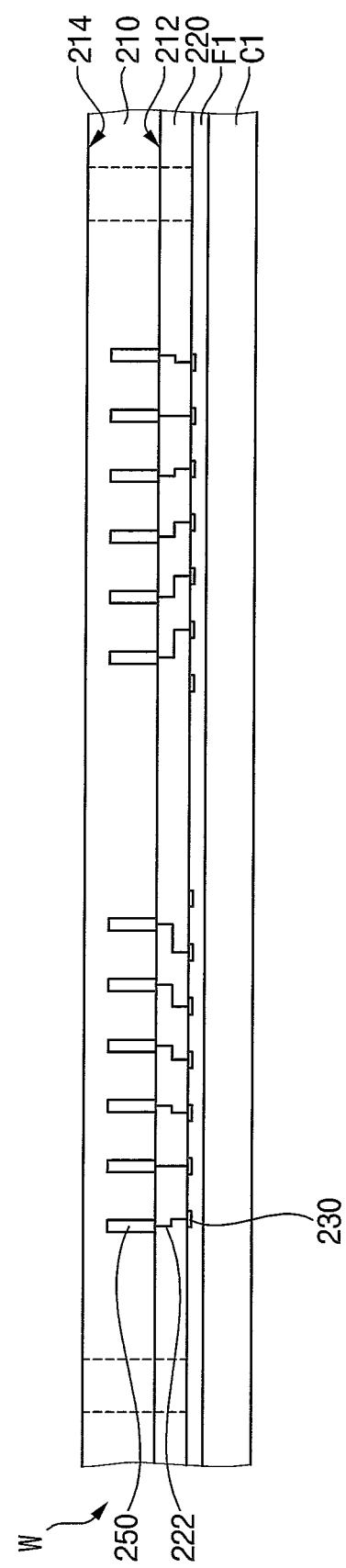
Figure 9:
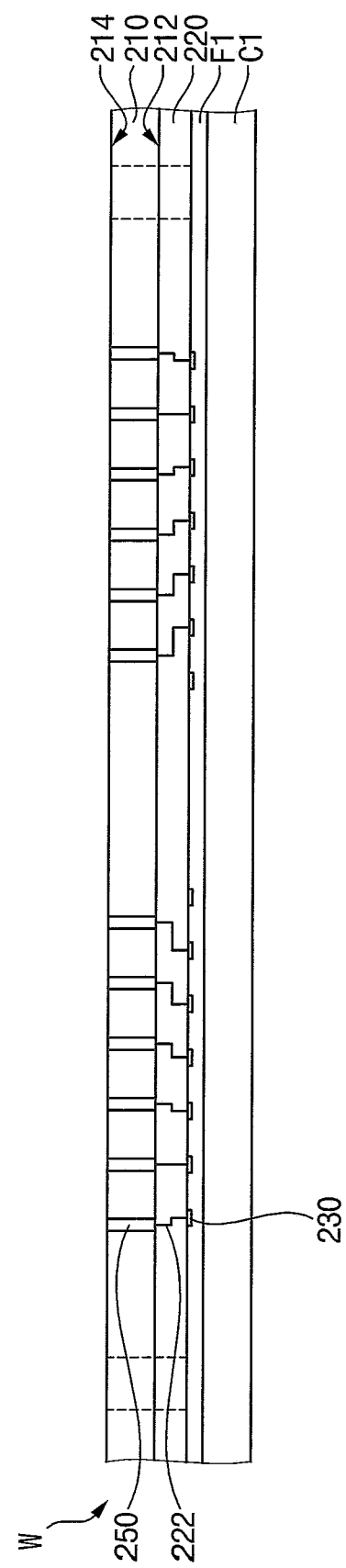
Figure 10:
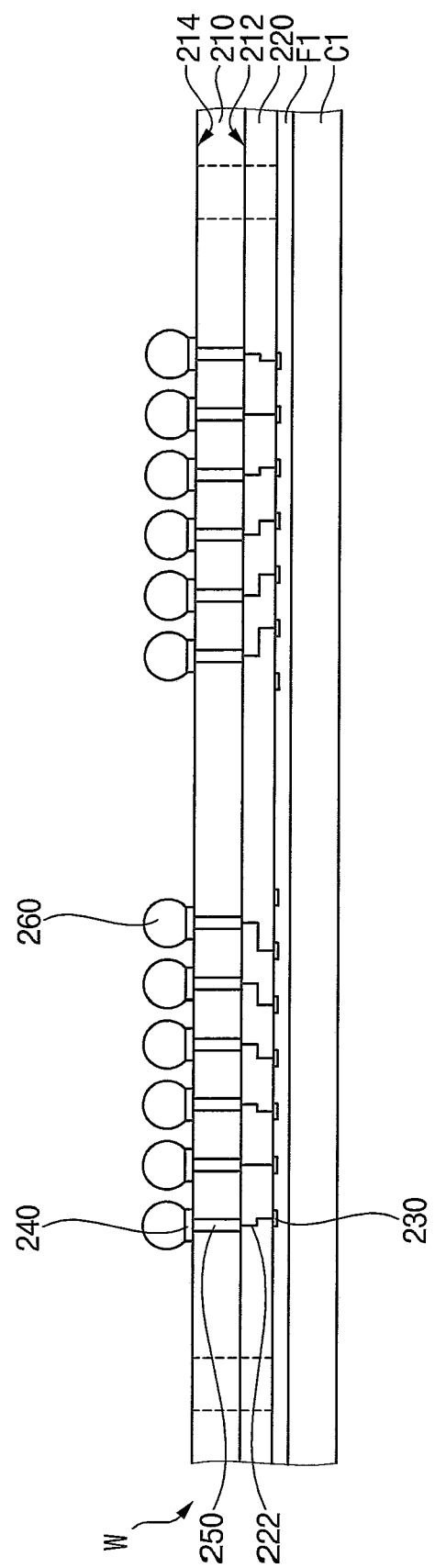

Referring to FIGS. 8 to 10, a second bonding pad 240 may be formed on the second surface 214 of the substrate 210, and a solder bump 260 as a conductive connection member may be formed on the second bonding pad 240.

As illustrated in FIGS. 8 and 9, the backside of the substrate 210, e.g., the second surface 214, may be grinded using a substrate support system WSS. The wafer W may be adhered to a carrier substrate C1 using a first adhesive film F1, and then, the second surface 214 of the substrate 210 may be grinded until a portion of the through electrode 250 is exposed.

The second surface 214 of the substrate 210 may be partially removed by a grinding process such as a chemical mechanical polishing (CMP) process. Thus, a thickness of the substrate 210 may be reduced to a desired/proper thickness. For example, the substrate 210 may have a thickness range of about 50 μm to 100 μm. Additionally, the portion of the through electrode 250 may be exposed from the second surface 214 of the substrate 210.

As illustrated in FIG. 10, the second bonding pad 240 may be formed on the second surface 214 of the substrate 210 to be electrically connected to the through electrode 250, and the solder bump 260 may be formed on the second bonding pad 240.

The second bonding pad 240 may be formed by forming a seed layer and a photoresist layer on the second surface 214 of the substrate 210, performing an exposure process on the photoresist layer to form a photoresist pattern having an opening that exposes a portion of the seed layer, and performing a plating process on the exposed portion of the seed layer.

For example, the second bonding pad 240 may have a diameter of 70 µm to 80 µm. The diameter of the second bonding pad 240 may be at least three times a diameter of the first bonding pad 230.

Then, the solder bump 260 may be formed on the second bonding pad 240.

For example, a seed layer may be formed on the second bonding pad 240 on the second surface 214 of the substrate 210, and a photoresist pattern having an opening that exposes a portion of the seed layer may be formed on the second surface 214 of the substrate 210.

Then, the opening of the photoresist pattern may be filled with a conductive material, and then, the photoresist pattern may be removed and a reflow process may be performed to form the solder bump 260. For example, the conductive material may be formed by a plating process. Alternatively, the solder bump may be formed by a screen printing process, a deposition process, etc.

The carrier substrate C1 may be removed from the wafer W.

Figure 11:
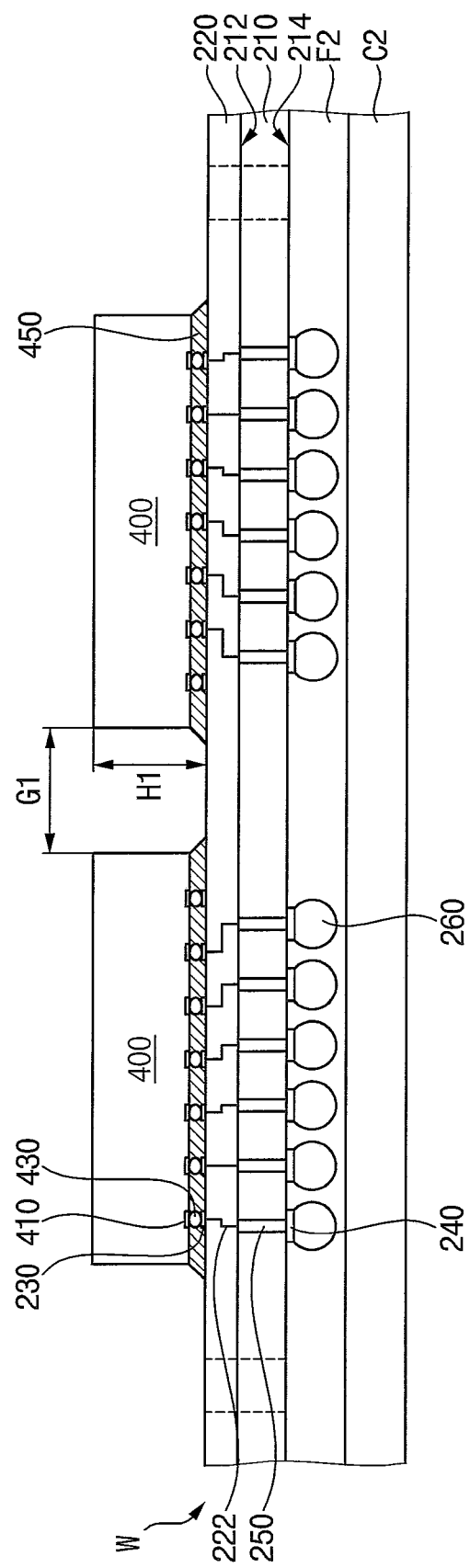
Figure 12:
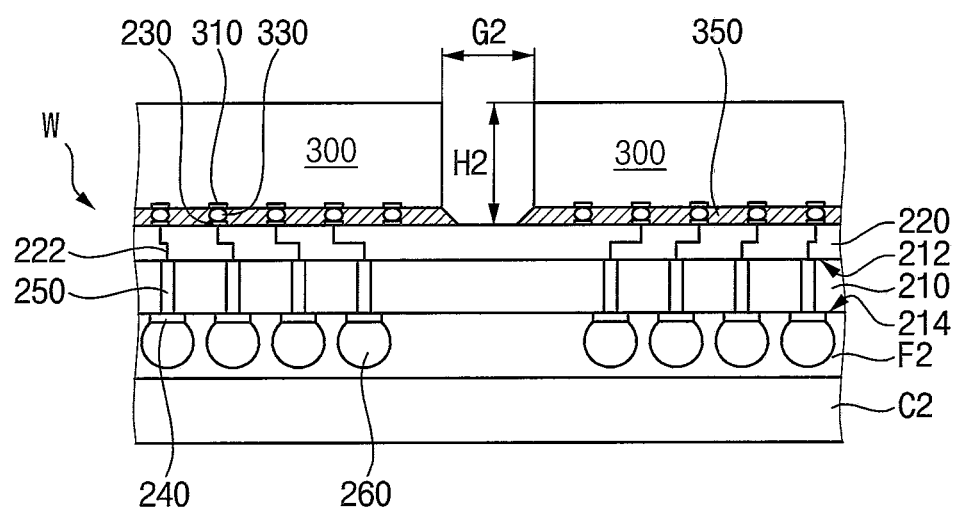

Referring to FIGS. 11 and 12, the structure in FIG. 10 may be reversed (flipped over), and a plurality of semiconductor devices 300 and 400 may be mounted on the wiring layer 220. Then, first and second underfill members 350 and 450 may be formed between the semiconductor devices 300 and 400 and the wiring layer 220.

Firstly, the wafer W may be adhered to a second carrier substrate C2 using a second adhesive film F2. The wafer W may be adhered to the second carrier substrate C2 such that the second surface 214 faces toward the second carrier substrate C2 and the first bonding pads 230 are exposed. Then, the first and second semiconductor devices 300 and 400 may be arranged on the wiring layer 220 to be spaced apart from each other.

In example embodiments, the first and second semiconductor devices 300 and 400 may be mounted on the wiring layer 220 in a flip chip bonding manner. Chip pads 310 of the first semiconductor device 300 may be electrically connected to the first bonding pads 230 of the wiring layer 220 by conductive bumps 330. Chip pads 410 of the second semiconductor device 400 may be electrically connected to the first bonding pads 230 of the wiring layer 220 by conductive bumps 430. For example, the conductive bumps 330 and 430 may include or may be micro bumps (uBump).

For example, the first semiconductor device 300 may include or may be a logic semiconductor device, and the second semiconductor device 400 may include or may be a memory device. The logic semiconductor device may include or may be a CPU, a GPU, an ASIC, or an SOC. The memory device may include or may be a high bandwidth memory (HBM) device. In this case, the second semiconductor device may include a buffer die and a plurality of memory dies (chips) sequentially stacked on the buffer die. The buffer die and the memory dies may be electrically connected to each other by through silicon vias.

As illustrated in FIG. 11, the second semiconductor devices 400 may be spaced apart from each other to form a first gap G1. For example, the first gap G1 may have a spacing distance in a range of 50 µm to 150 µm. A first height H1 of the second semiconductor device 400 may be 700 µm or more. The second semiconductor device 400 may have an area of 10 mm×10 mm or more. For example, each side of the second semiconductor device 400 may have a length of 10 mm or greater in a plan view.

As illustrated in FIG. 12, the first semiconductor devices 300 may be spaced apart from each other to form a second gap G2. For example, the second gap G2 may have a spacing distance within a range of 20 µm to 100 µm. The first semiconductor device 300 may have a second height H2 less than or the same as the height H1 of the second semiconductor device 400. The second height H2 of the first semiconductor device 300 may be 500 µm or more. The first semiconductor device 300 may have an area of 20 mm×20 mm or more. For example, each side of the first semiconductor device 300 may have a length of 20 mm or greater in a plan view.

Then, an underfill solution may be dispensed between the first semiconductor devices 300 and the wiring layer 220 and between the second semiconductor devices 400 and the wiring layer 220 while moving a dispenser nozzle along edges of the first and second semiconductor devices 300 and 400, and the underfill solution may be cured to form the first and second underfill members 350 and 450. The first underfill member 350 may extend between the first semiconductor device 300 and the wiring layer 220 to reinforce a gap between the first semiconductor device 300 and the wiring layer 220. For example, the first underfill member 350 may be beneficial for adhesion between the first semiconductor device 300 and the wiring layer 220. The second underfill members 450 may extend between the second semiconductor device 400 and the wiring layer 220 to reinforce a gap between the second semiconductor device 400 and the wiring layer 220. For example, the second underfill member 450 may be beneficial for adhesion between the second semiconductor device 400 and the wiring layer 220.

The first and second underfill members 350 and 450 may include or be formed of a material having a relatively high fluidity so as to effectively fill small spaces between the first and second semiconductor devices 300 and 400 and the wiring layer 220. For example, the first and second underfill members may include or be formed of an adhesive including an epoxy material. The first and second underfill members 350 and 450 may have a coefficient of thermal expansion greater than those of the first and second semiconductor devices 300 and 400. The first and second underfill members 350 and 450 may have a coefficient of thermal expansion within a range of 20 ppm/° C. to 30 ppm/° C. The first and second semiconductor devices 300 and 400 may have a coefficient of thermal expansion within a range of 1 ppm/° C. to 4 ppm/° C. The wafer W may have a coefficient of thermal expansion the same as or similar to those of the first and second semiconductor devices 300 and 400.

Figure 13:
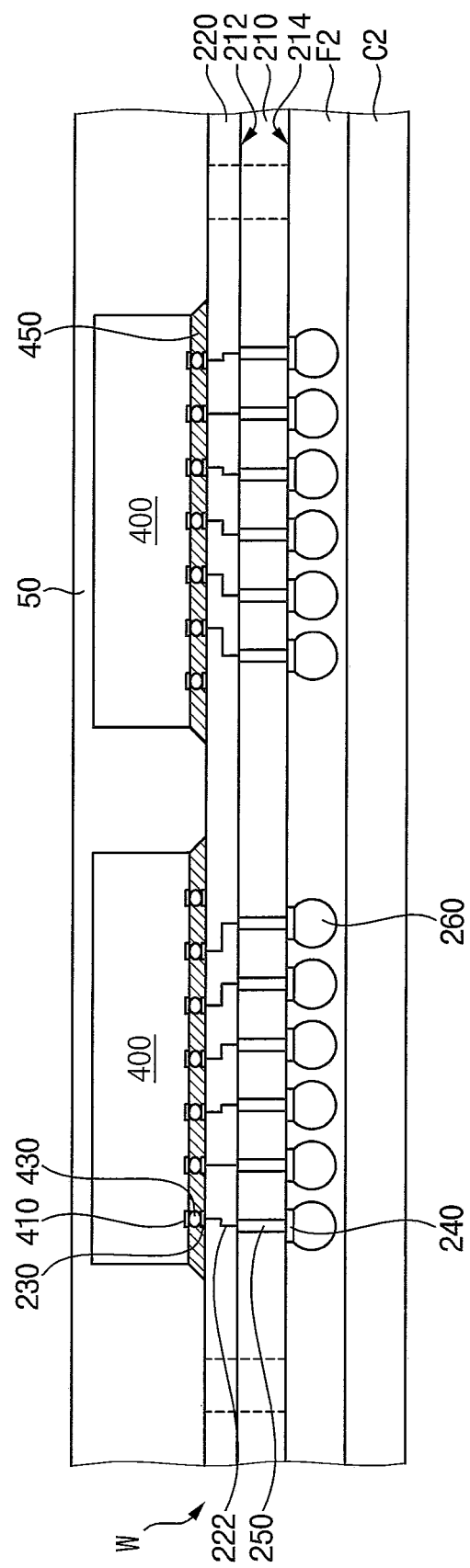
Figure 14:
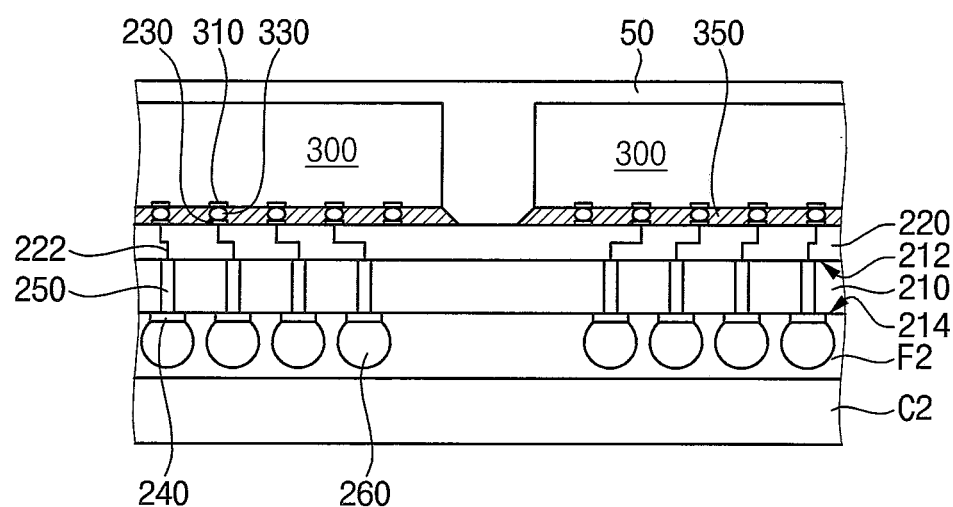

Referring to FIGS. 13 and 14, a molding material 50 may be formed on the wiring layer 220 to cover the first and second semiconductor devices 300 and 400.

In example embodiments, the molding material 50 may be formed to cover side surfaces and upper surfaces of the first and second semiconductor devices 300 and 400. The molding material 50 may be formed to completely fill the gaps G1 and G2 between the first and second semiconductor devices 300 and 400. For example, the molding material 50 may be formed using a polymer material such as an epoxy molding compound (EMC) by a molded underfill (MUF) process. The molding material 50 may have a coefficient of thermal expansion greater than those of the first and second semiconductor devices 300 and 400. The molding material 50 may have a coefficient of thermal expansion within a range of 5 ppm/° C. to 15 ppm/° C.

Figure 15:
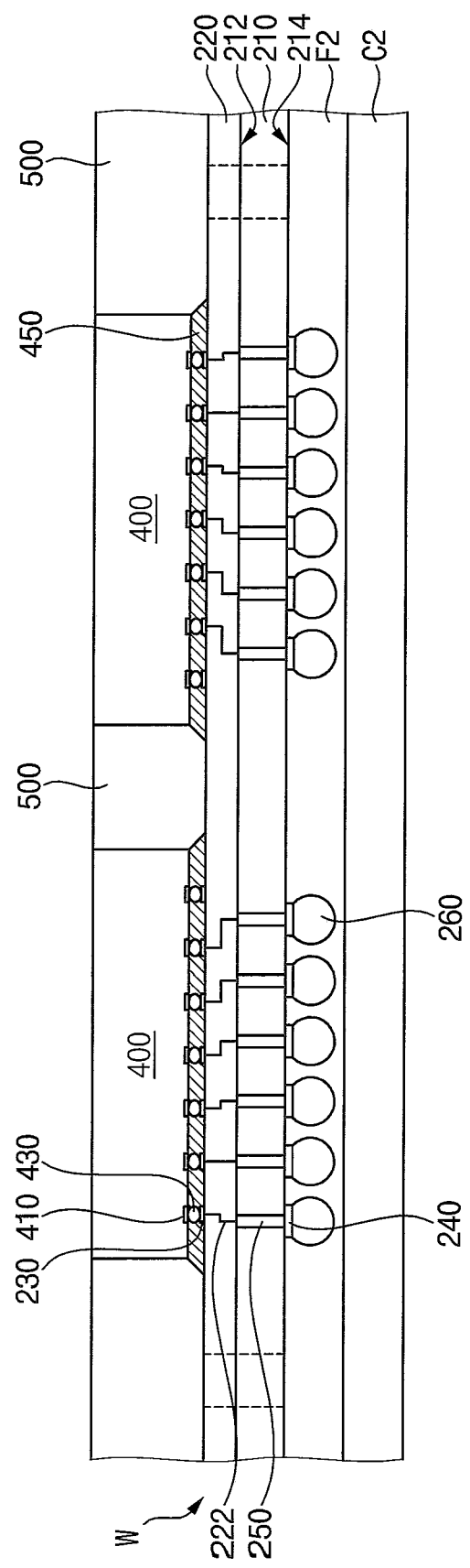
Figure 16:
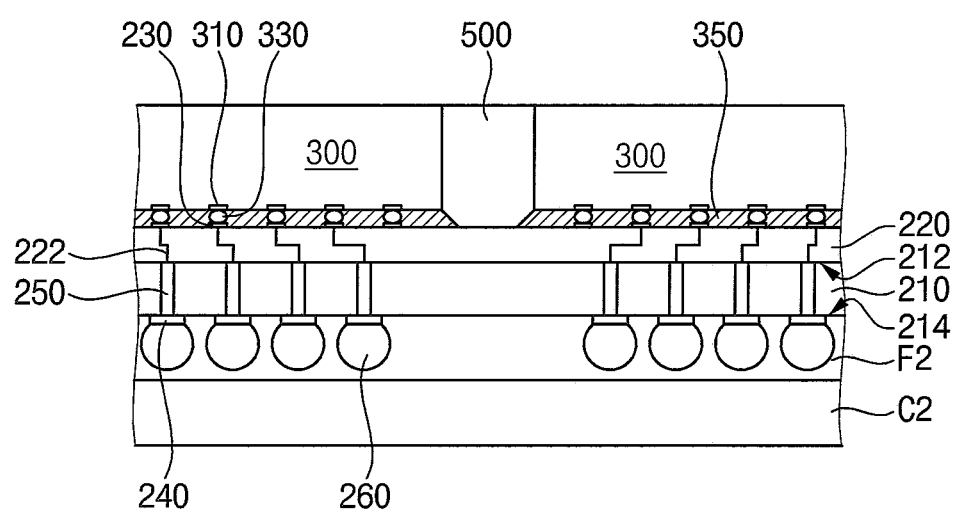

Referring to FIGS. 15 and 16, an upper surface/portion of the molding material 50 may be partially removed to form a molding layer 500 that exposes the upper surfaces of the first and second semiconductor devices 300 and 400.

For example, the molding material 50 may be partially removed by a grinding process such as a chemical mechanical polishing (CMP) process. The upper surfaces of the first and second semiconductor devices 300 and 400 may be exposed by the molding layer 500. The upper surface of the molding layer 500 may be coplanar with the upper surface of the first semiconductor device 300 and/or the upper surface of the second semiconductor device 400. The side surfaces of the first and second semiconductor devices 300 and 400 may be covered by the molding layer 500.

Figure 17:
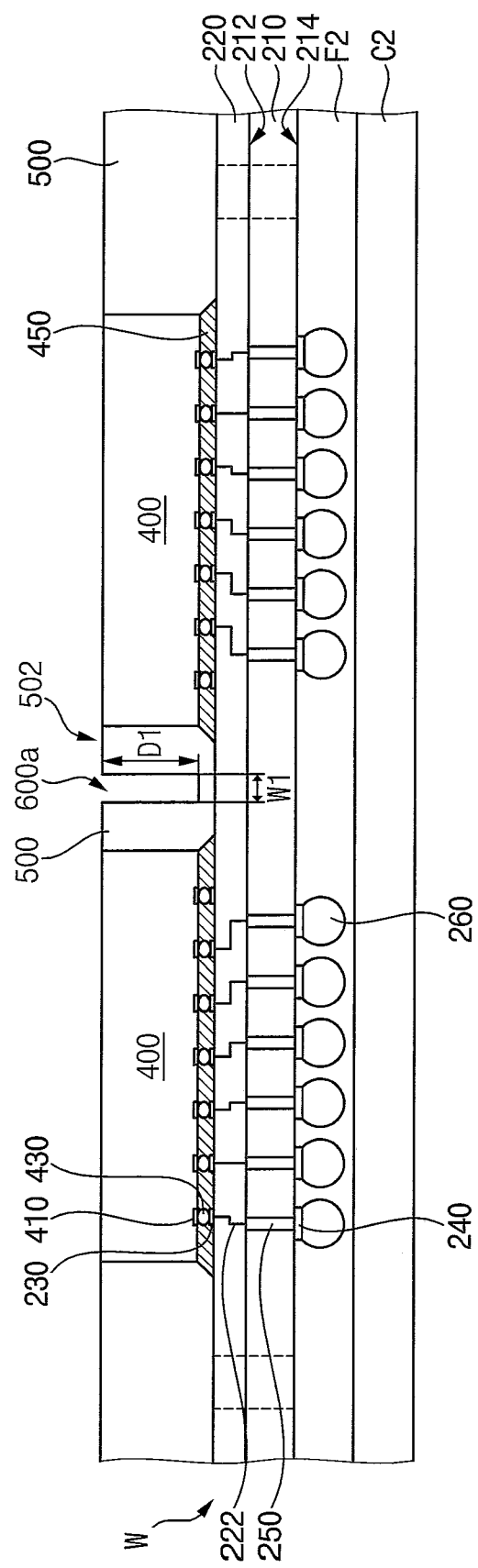
Figure 18:
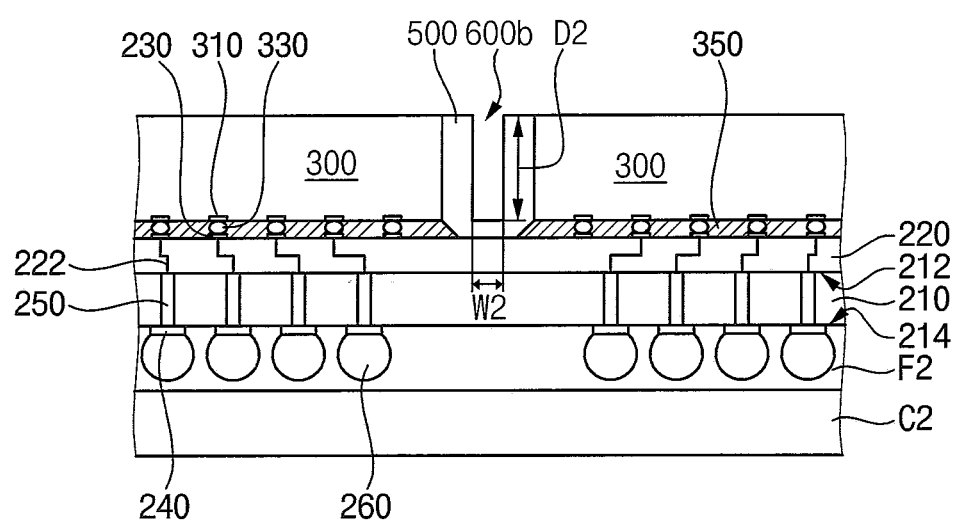

Referring to FIGS. 17 and 18, the molding layer 500 between the first and second semiconductor devices 300 and 400 may be partially removed to form grooves 600a and 600b. The grooves may be formed by removing a portion of the molding layer 500 using a blade, laser, plasma, or the like.

As illustrated in FIG. 17, the first groove 600a may be formed in the molding layer 500 between the second semiconductor devices 400 to extend in a direction parallel to side surfaces of the second semiconductor devices 400 facing each other. The first groove 600a may have a first depth D1 from an upper surface 502 of the molding layer 500. For example, the first depth D1 of the first groove 600a may be 30% to 100% of the first height H1 of the second semiconductor device 400. A first width W1 of the first groove 600a may be 20% to 100% of the first gap G1.

When the first depth D1 of the first groove 600a is equal to the first height H1 of the second semiconductor device 400, the wiring layer 220 of the interposer 200 may be exposed on a bottom surface of the first groove 600a. When the first width W1 of the first groove 600a is equal to a spacing distance of the first gap G1, the side surface of the second semiconductor device 400 may be exposed on a sidewall of the first groove 600a.

As illustrated in FIG. 18, the second groove 600b may be formed in the molding layer 500 between the first semiconductor devices 300 to extend in a direction parallel to side surfaces of the first semiconductor devices 300 facing each other. The second groove 600b may have a second depth D2 from the upper surface 502 of the molding layer 500. For example, the second depth D2 of the second groove 600b may be 30% to 100% of the second height H2 of the first semiconductor device 300. A second width W2 of the second groove 600b may be 20% to 100% of the second gap G2. The second width W2 of the second groove 600b may be the same as or less than the first width W1 of the first groove 600a.

When the second depth D2 of the second groove 600b is equal to the second height H2 of the first semiconductor device 300, the wiring layer 220 of the interposer 200 may be exposed on a bottom surface of the second groove 600b. When the second width W2 of the second groove 600b is equal to a spacing distance of the second gap G2, the side surface of the first semiconductor device 300 may be exposed on a sidewall of the second groove 600b.

Figure 19:
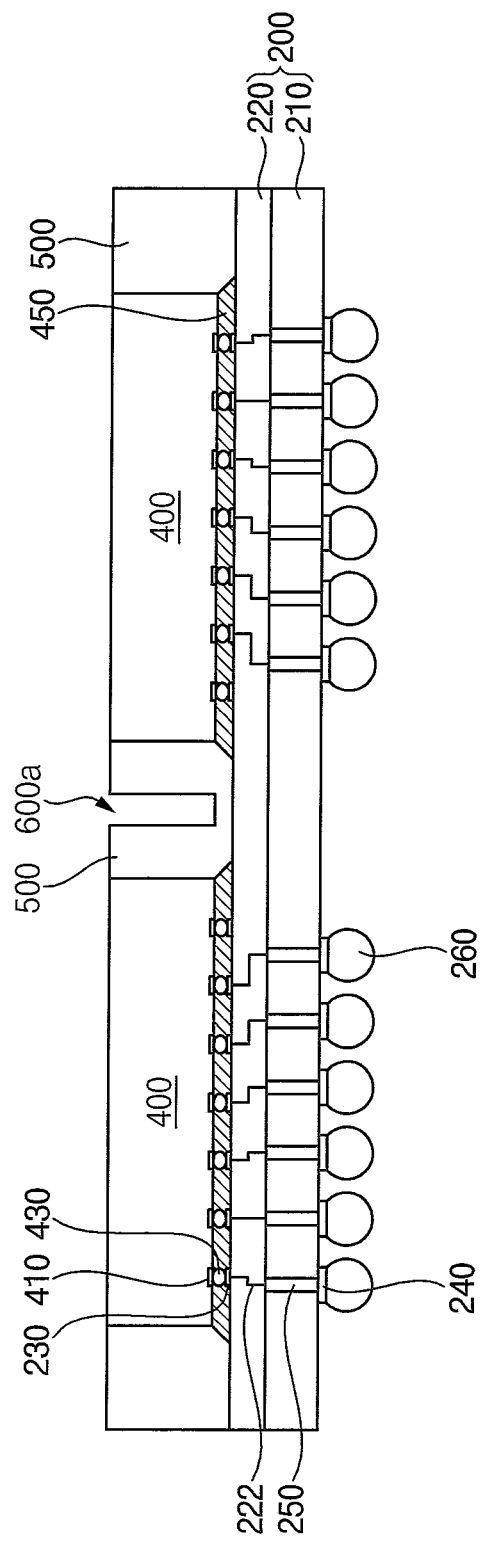
Figure 20:
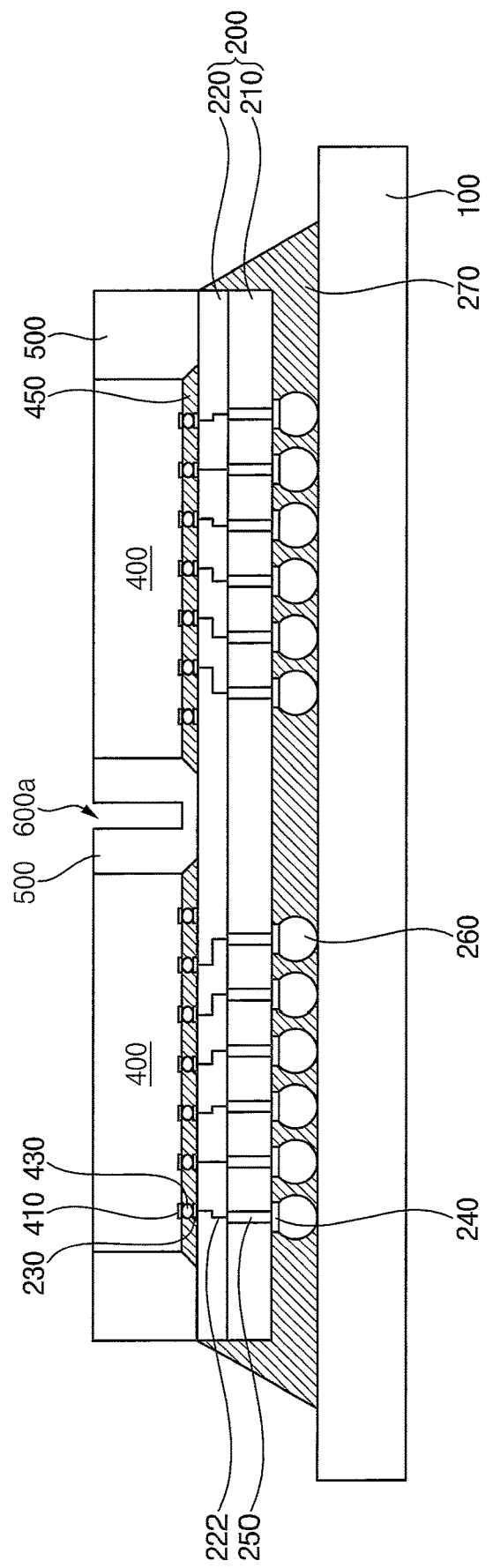

Referring to FIGS. 19 and 20, the wafer W may be cut along the cutting region CA to form the individual interposer 200, and the interposer 200 on which the first and second semiconductor devices 300 and 400 are mounted may be disposed on a package substrate 100. Then, a third underfill member 270 may be formed between the interposer 200 and the package substrate 100.

In example embodiments, the interposer 200 may be mounted on the package substrate 100 through the solder bumps 260. The interposer 200 may be attached on the package substrate 100 by a mass reflow process. Then, an underfill solution may be dispensed between the interposer 200 and the package substrate 100 while moving a dispenser nozzle along edges of the interposer 200, and the underfill solution may be cured to form the third underfill member 270. For example, the mass reflow process may be a reflow soldering process in which a reflow soldering is performed together with respect to a plurality of package substrate 100 on which interposers 200 are respectively mounted.

In the mass reflow process, package substrates 100 on which interposers 200 are disposed respectively may be loaded into a reflow oven at once, and then, the reflow process may be performed on the package substrates 100 within the reflow oven. The mass reflow process may have advantages in mass production compared to a thermocompression process and a local reflow process.

The mass reflow process may be sensitive to a warpage behavior between the molded interposer and the package substrate depending on a reflow temperature in the reflow oven. For example, when a bending behavior of the molded interposer at a solder melting point and/or its vicinity does not match the package substrate, non-wetting may occur. For example, at the solder melting temperature and/or its vicinity, the interposer 200 may be bent in the form of a crying warpage. The crying warpage may be a form of warpage in which a center portion of the interposer 200 may bend upwards and edge portions of the interposer 200 may bend downwards.

In example embodiments, the first and second grooves 600a and 600b may be formed in the molding layer 500 between the first semiconductor devices 300 and between the second semiconductor devices 400 to extend in a direction parallel to adjacent side surfaces of the first and second semiconductor devices 300 and 400. Since the molded interposer includes the first and second grooves, warpage behavior at a high temperature may be minimized, and the rigidity of the molded interposer itself may be reduced to improve solder wettability in the reflow process.

Then, outer connection members such as solder balls may be formed on outer connection pads on a lower surface of the package substrate 100 respectively to complete the semiconductor package 10 in FIG. 1.

Figure 21:
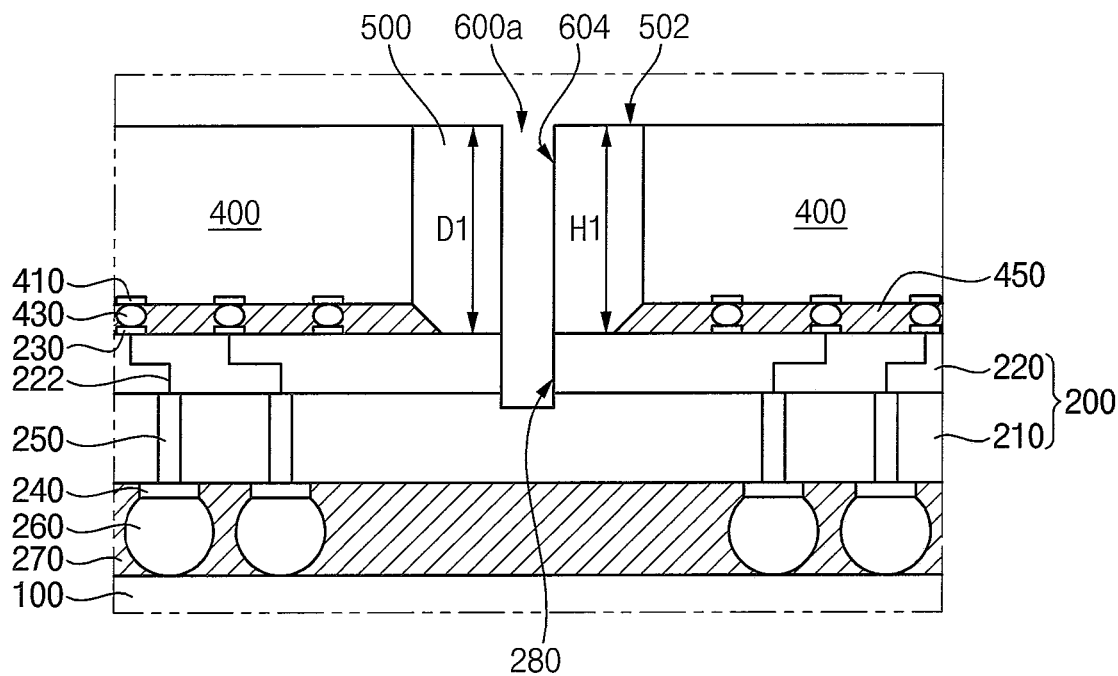

FIG. 21 is a cross-sectional view illustrating a portion of a semiconductor package according to example embodiments. The semiconductor package may be substantially the same as or similar to the semiconductor package described with reference to FIGS. 1 to 5 except for a shape of a groove and a configuration of an additional recess. Thus, same reference numerals will be used to refer to the same or like elements and repetitive explanation concerning the above elements will be omitted.

Referring to FIG. 21, a molding layer 500 may have a first groove 600a extending in a direction parallel to adjacent side surfaces of second semiconductor devices 400 between adjacent second semiconductor devices 400. A first depth D1 of the first groove 600a may be equal to a first height of the second semiconductor device 400. An interposer 200 may be exposed on a bottom surface of the first groove 600a.

In example embodiments, the interposer 200 may have a first recess 280 connected to the first groove 600a. For example, the first recess 280 and the first groove 600a may be continuously and integrally formed as shown in FIG. 21. The first recess 280 may be provided in a wiring layer 220 of the interposer 200. Alternatively, the first recess 280 may penetrate a portion of the wiring layer 220 of the interposer 200 and extend from an upper surface of a semiconductor substrate 210 to a predetermined depth. For example, the first recess 280 may extend from a top surface of the interposer 200 to a portion of the semiconductor substrate 210, e.g., below a top surface of the semiconductor substrate 210.

The first recess 280 of the interposer 200 may be formed together when forming the first groove 600a. Processes the same as or similar to the processes described with reference to FIG. 17 may be performed to remove a portion of the molding layer 500 and a portion of the interposer 200 to form the first groove 600a and the first recess 280. The first groove 600a and the first recess 280 may form one first trench extending between the second semiconductor devices 400, e.g., in a direction parallel to adjacent side surfaces of the second semiconductor devices 400.

Additionally, the molding layer 500 may have a second groove 600b extending in a direction parallel to adjacent side surfaces of first semiconductor devices 300 between adjacent first semiconductor devices 300. A second depth of the second groove 600b may be equal to a second height of the second semiconductor devices 400. The interposer 200 may be exposed on a bottom surface of the second groove 600b. In this case, the interposer 200 may have a second recess connected to the second groove 600b, e.g., similarly to the first groove 600a and the first recess 280. The second groove 600b and the second recess may form one second trench extending between the first semiconductor devices. The first and second trenches may extend along a center line of the interposer 200, e.g., in a plan view, to communicate with each other.

Figure 22:
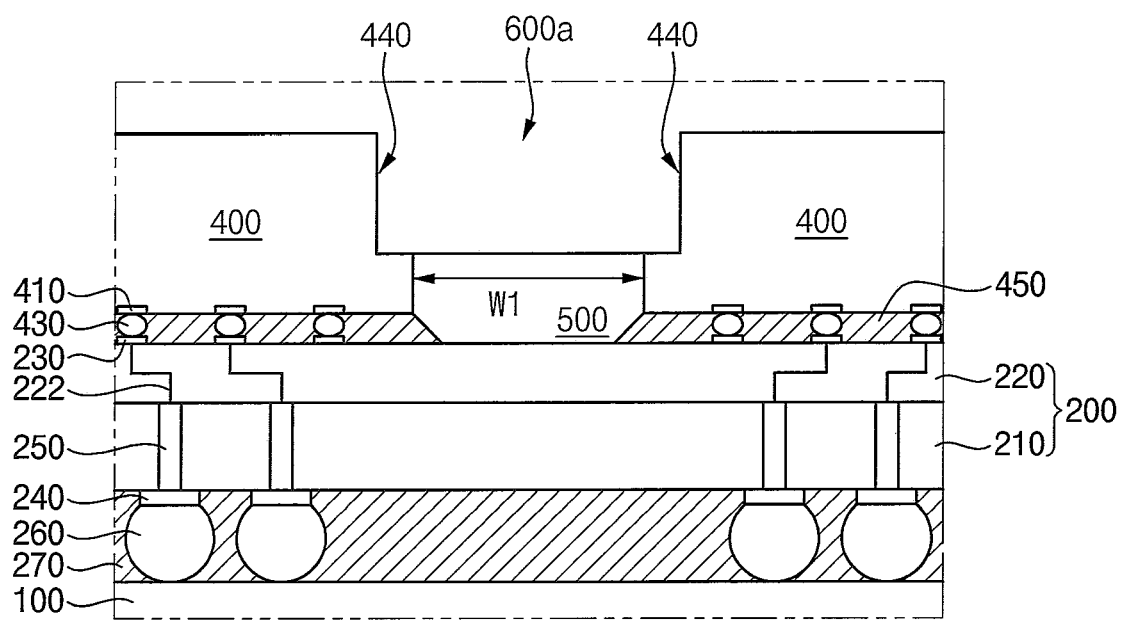

FIG. 22 is a cross-sectional view illustrating a portion of a semiconductor package according to example embodiments. The semiconductor package may be substantially the same as or similar to the semiconductor package described with reference to FIGS. 1 to 5 except for a shape of a groove and a configuration of an additional recess. Thus, same reference numerals will be used to refer to the same or like elements and repetitive explanation concerning the above elements will be omitted.

Referring to FIG. 22, a molding layer 500 may have a first groove 600a extending in one direction between adjacent second semiconductor devices 400. A first width W1 of the first groove 600a may be equal to a first gap between the second semiconductor devices 400. A side surface of the second semiconductor device 400 may be exposed on a sidewall of the first groove 600a.

In example embodiments, the second semiconductor device 400 may have a third recess 440 connected to the first groove 600a. The third recesses 440 may be provided in the side surfaces of the second semiconductor devices 400 opposite to each other. A bottom surface of the third recess 440 may be coplanar with a bottom surface of the first groove 600a. For example, second semiconductor devices 400 may have side surfaces facing the first groove 600a formed in the molding layer 500, and the side surfaces of the second semiconductor devices 400 may have step structures as shown in FIG. 22.

The third recess 440 of the second semiconductor device 400 may be formed together when forming the first groove 600a. Processes the same as or similar to the processes described with reference to FIG. 17 may be performed to remove a portion of the molding layer 500 and a portion of the second semiconductor device 400 to form the first groove 600a and the third recess 440. The first groove 600a and the third recess 440 may form a third trench extending between the second semiconductor devices 400.

The molding layer 500 may have a second groove extending in one direction between adjacent first semiconductor devices 300. A second width of the second groove may be equal to a second gap between the first semiconductor devices 300. A side surface of the first semiconductor device 300 may be exposed on a sidewall of the second groove. In this case, the first semiconductor device 300 may have a fourth recess connected to the second groove. The second groove and the fourth recess may form a fourth trench extending between the first semiconductor devices 300. The third and fourth trenches may extend along a center line of the interposer 200, e.g., in a plan view, to communicate with each other. For example, the first semiconductor devices 300 may have side surfaces facing the second groove 600b formed in the molding layer 500, and the side surfaces of the first semiconductor devices 300 may have step structures similarly to the side surfaces of the second semiconductor devices 400 shown in FIG. 22.

Figure 23:
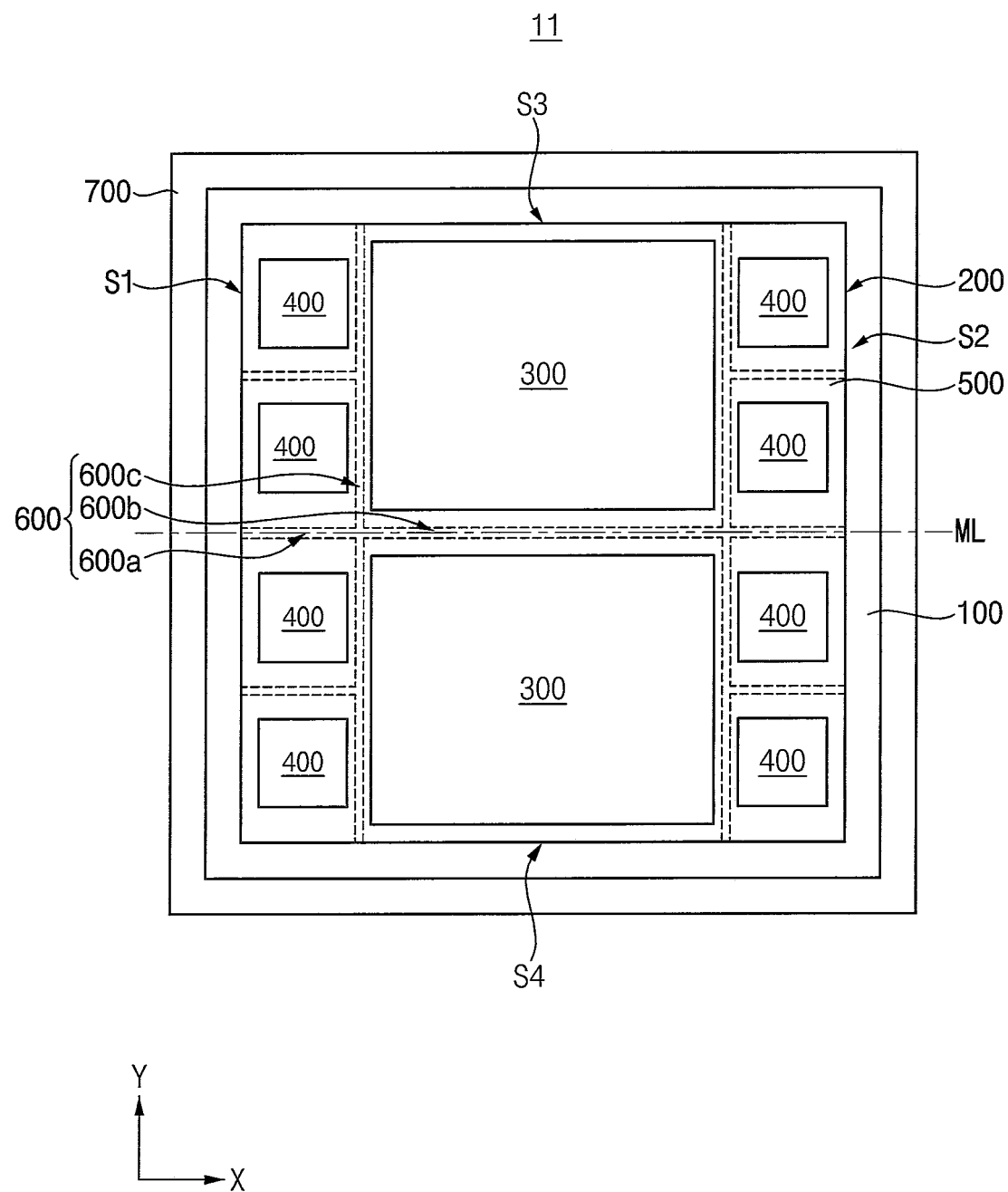

FIG. 23 is a plan view illustrating a semiconductor package according to example embodiments. The semiconductor package may be substantially the same as or similar to the semiconductor package described with reference to FIGS. 1 to 5 except for an arrangement of grooves. Thus, same reference numerals will be used to refer to the same or like elements and repetitive explanation concerning the above elements will be omitted.

Referring to FIG. 23, a molding layer 500 of a semiconductor package 11 may have a plurality of grooves 600 arranged in a lattice form between first and second semiconductor devices 300 and 400.

For example, the molding layer 500 may include first grooves 600a extending in a first direction (X direction) between the second semiconductor devices 400, a second groove 600b extending in the first direction (X direction) between the first semiconductor devices 300, and third grooves 600c extending in a second direction (Y direction) between the first semiconductor devices 300 and the second semiconductor devices 400.

In example embodiments, the third grooves 600c may intersect with and/or be connected to the first grooves 600a. The third grooves 600c may extend to intersect with and/or be connected to the first grooves 600a spaced apart from each other along a first side surface S1. The third grooves 600c may extend to intersect and/or be connected to the first grooves 600a spaced apart from each other along a second side surface S2.

The first and second semiconductor devices 300 and 400 may have a rectangular plate shape having four side surfaces. At least two grooves may be provided to extend along at least two of the four side surfaces of each semiconductor device respectively, e.g., in a plan view.

Figure 24:
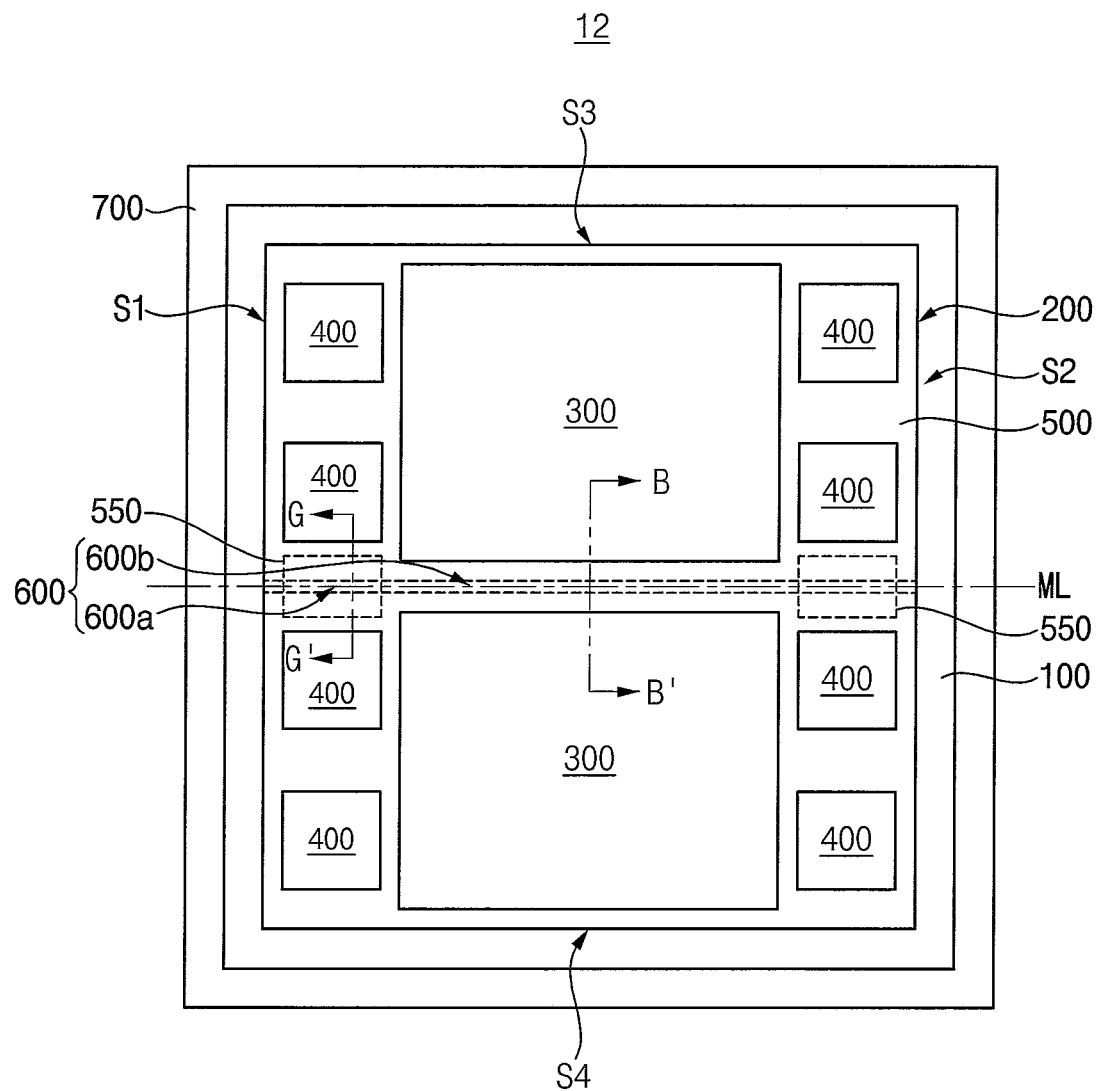
Figure 25:
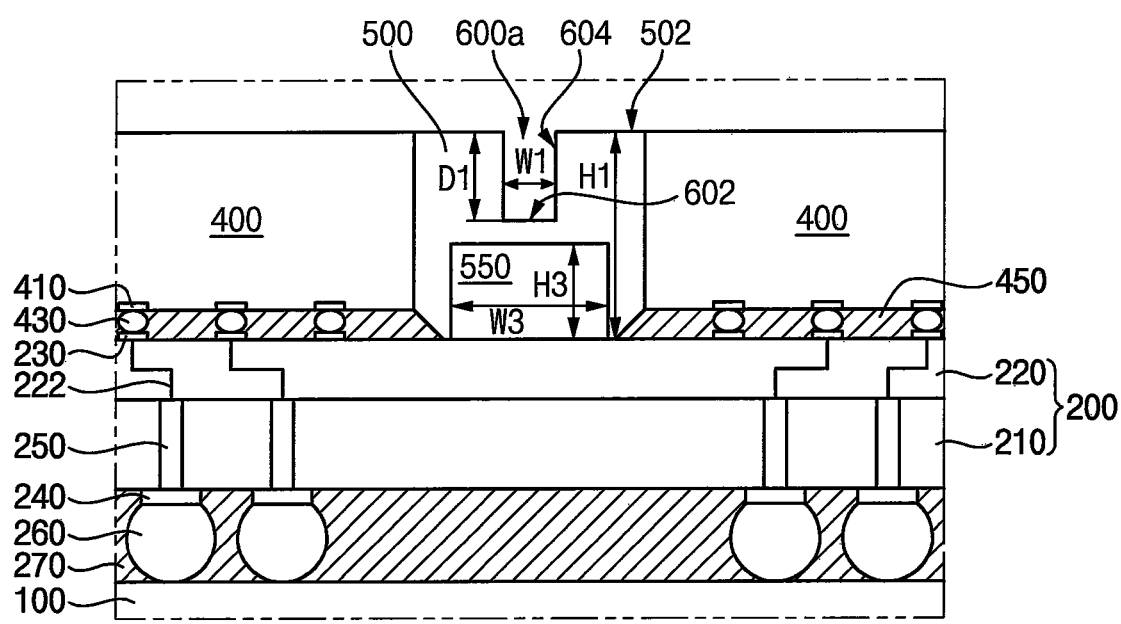

FIG. 24 is a plan view illustrating a semiconductor package according to example embodiments. FIG. 25 is a cross-sectional view taken along the line G-G' in FIG. 24. The semiconductor package may be substantially the same as or similar to the semiconductor package described with reference to FIGS. 1 to 5 except for an additional dummy member. Thus, same reference numerals will be used to refer to the same or like elements and repetitive explanation concerning the above elements will be omitted.

Referring to FIGS. 24 and 25, a semiconductor package 12 may include a dummy member 550 arranged between second semiconductor devices 400 on an interposer 200. The semiconductor package 12 may further include another dummy member arranged between first semiconductor devices 300 or between a first semiconductor device 300 and a second semiconductor device 400.

In example embodiments, the dummy member 550 may extend in a first direction (X direction) along a center line ML between the second semiconductor devices 400. For example, the dummy member 550 may vertically overlap the center line ML of the interposer 200. The dummy member 550 may be attached to an upper surface of the interposer 200 by an adhesive film such as a die attach film (DAF). For example, the dummy member 550 may include or be formed of a silicon material. For example, the dummy member 550 may be a semiconductor chip, e.g., a silicon chip, which does not include any circuit and any electronic device in the semiconductor chip.

The dummy member 550 may have a third height H3 smaller than a height H1 of the second semiconductor device 400. The third height H3 of the dummy member 550 may be 30% to 60% of the height H1 of the second semiconductor device 400. A third width W3 of the dummy member 550 may be 50% to 90% of the gap between the second semiconductor devices 400, e.g., at which the dummy member 550 is disposed.

The molding layer 500 may be provided on the upper surface of the interposer 200 to cover the first and second semiconductor devices 300 and 400 and the dummy member 550. The molding layer 500 may cover an upper surface and a side surface of the dummy member 550. A first groove 600a may be located above the dummy member 550. For example, the first groove 600a may vertically overlap the dummy member 550.

Hereinafter, a method of manufacturing the semiconductor package in FIG. 24 will be explained.

FIGS. 26 to 29 are cross-sectional views illustrating a method of manufacturing a semiconductor package according to example embodiments.

Figure 26:
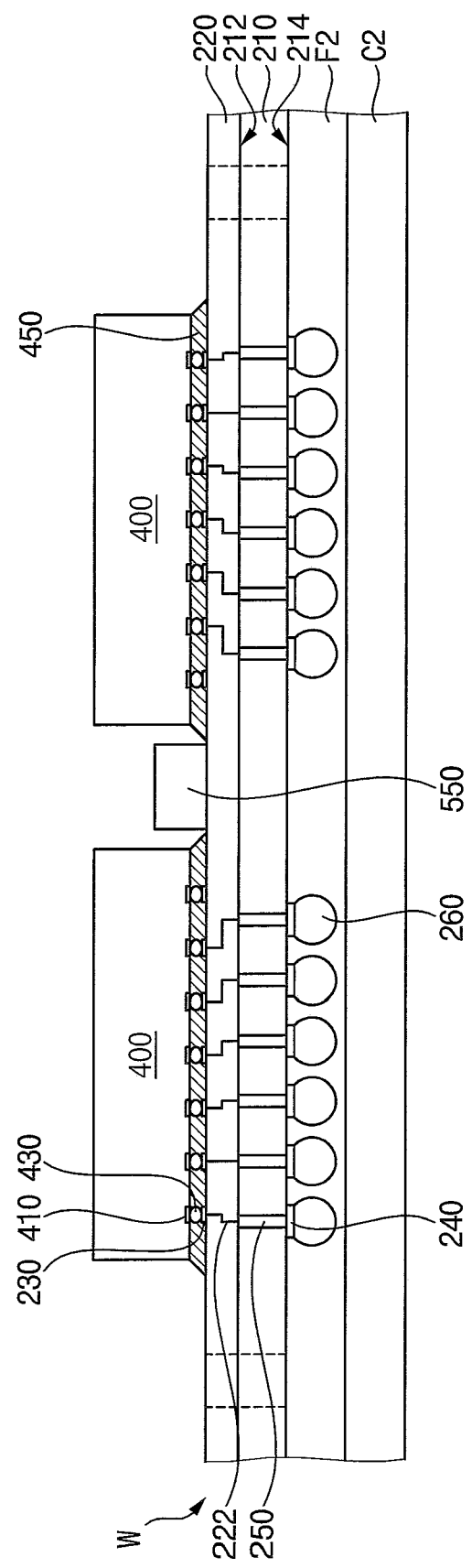

Referring to FIG. 26, first, processes the same as or similar to the processes described with reference to FIGS. 6 to 11 may be performed to mount a plurality of semiconductor devices 300 and 400 on an interposer 200. Then, a dummy member 550 may be arranged on the interposer 200 between the second semiconductor devices 400.

In example embodiments, the dummy member 550 may be disposed on a wiring layer 220 to extend in a first direction (X direction) along a center line ML between the second semiconductor devices 400. The dummy member 550 may be attached on the wiring layer 220 by adhesive films such as a die attach film (DAF). For example, the dummy member 550 may include or be formed of a silicon material.

The dummy member 550 may have a height smaller than a height of the second semiconductor device 400. The height of the dummy member 550 may be 30% to 60% of the height of the second semiconductor device 400.

Figure 27:
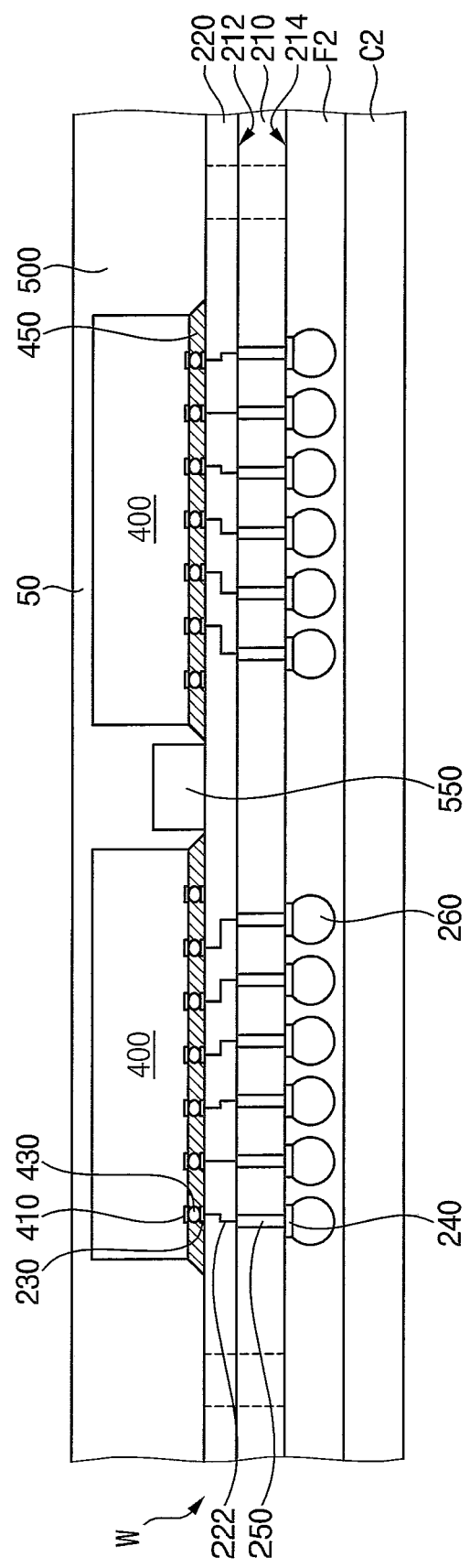
Figure 28:
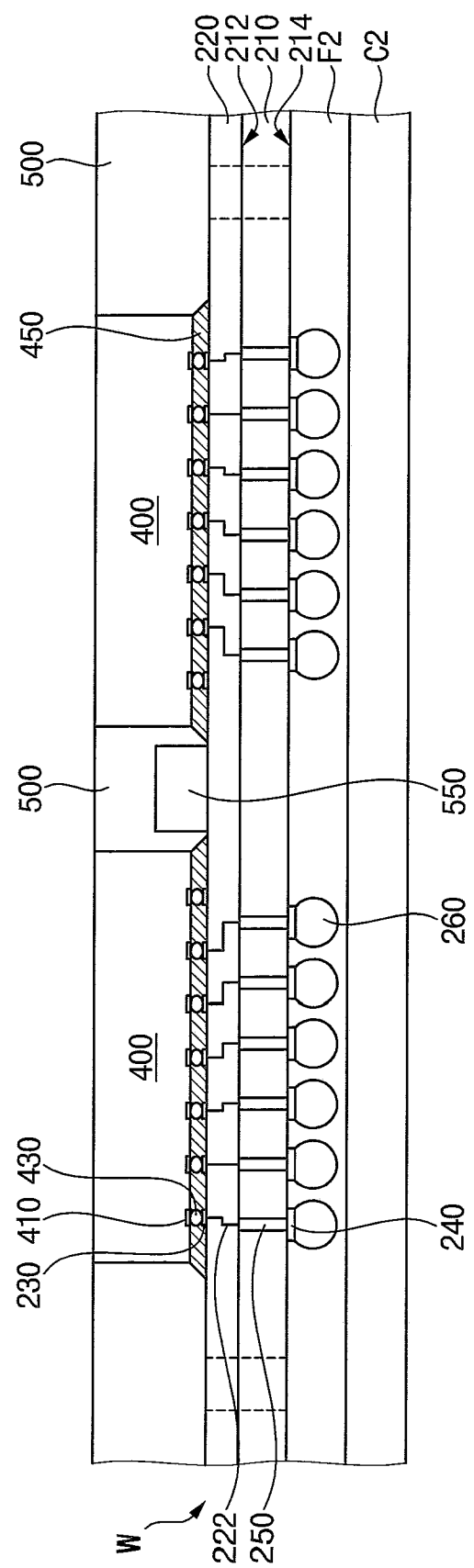

Referring to FIGS. 27 and 28, a molding material 50 may be formed on the wiring layer 220 to cover the first and second semiconductor devices 300 and 400 and the dummy member 550, and an upper surface of the molding material 50 may be partially removed to form a molding layer 500 that exposes upper surfaces of the first and second semiconductor devices 300 and 400.

Figure 29:
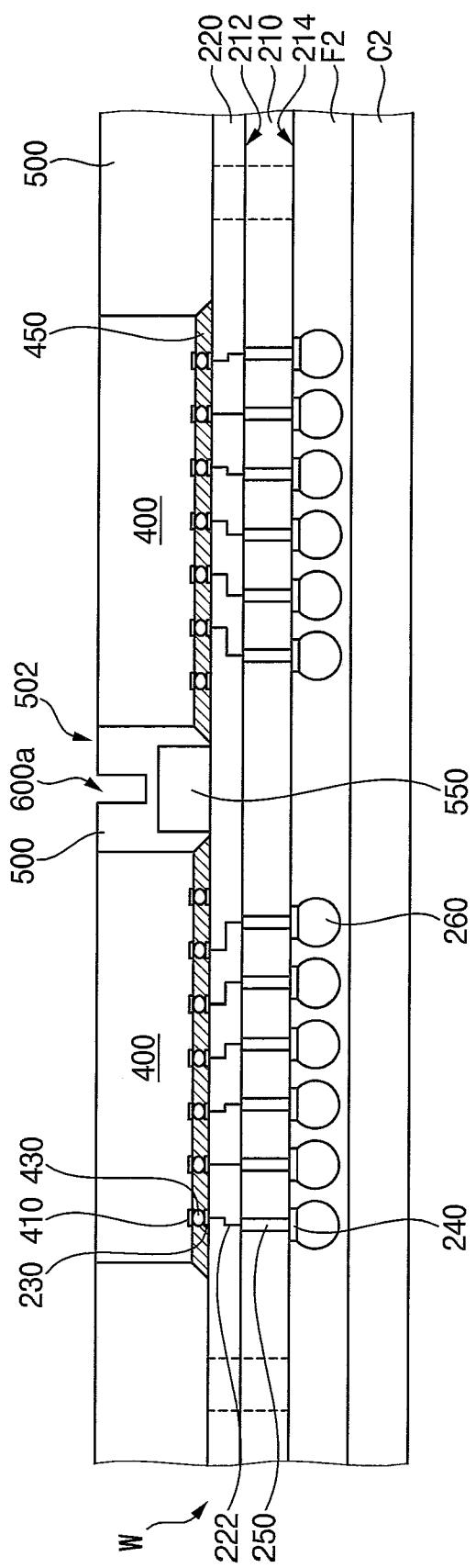

Referring to FIG. 29, the molding layer 500 between the first and second semiconductor devices 300 and 400 may be partially removed to form grooves 600a and 600b. The groove may be formed by removing a portion of the molding layer 500 using a blade, laser, plasma, or the like.

As illustrated in FIG. 29, a first groove 600a may be formed in the molding layer 500 to extend in a direction between the second semiconductor devices 400. The first groove 600a may have a first depth D1 from an upper surface 502 of the molding layer 500. The first groove 600a may be located above the dummy member 550.

Then, processes the same as or similar to the processes described with reference to FIGS. 19 and 20 may be performed to complete the semiconductor package 12 in FIG. 24.

Figure 30:
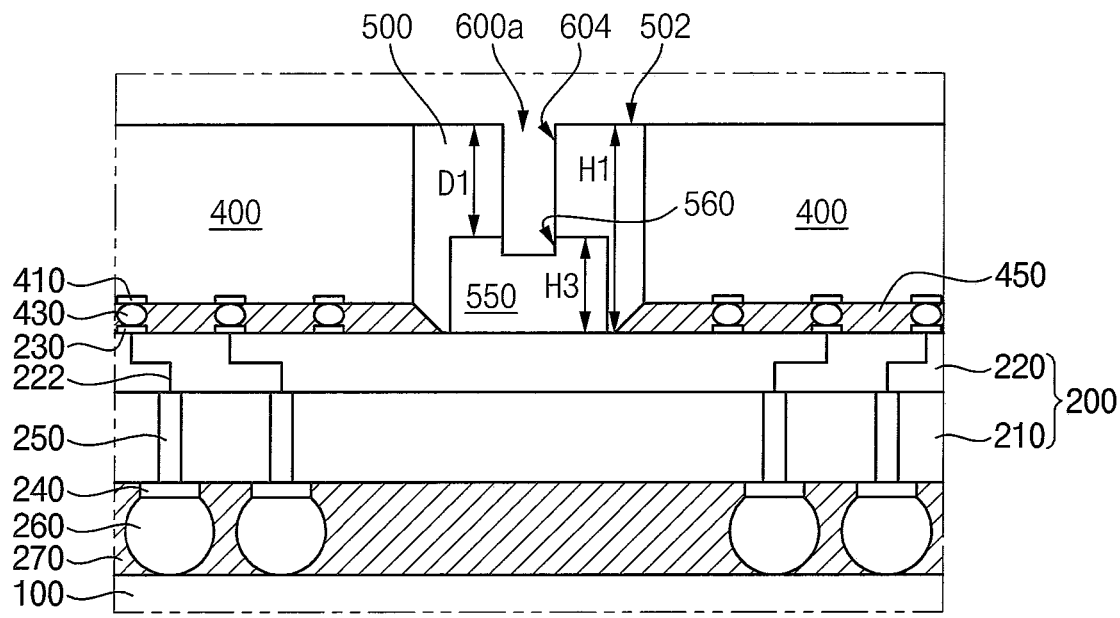

FIG. 30 is a cross-sectional view illustrating a portion of a semiconductor package according to example embodiments. The semiconductor package may be substantially the same as or similar to the semiconductor package described with reference to FIGS. 24 and 25 except for a shape of a groove and a configuration of an additional recess. Thus, same reference numerals will be used to refer to the same or like elements and repetitive explanation concerning the above elements will be omitted.

Referring to FIG. 30, a molding layer 500 may have a first groove 600a extending in a direction between adjacent second semiconductor devices 400. A first depth D1 of the first groove 600a may be equal to a difference between a first height H1 of the second semiconductor device 400 and a third height H3 of a dummy member 550. The dummy member 550 may be exposed on a bottom surface of the first groove 600a.

In example embodiments, the dummy member 550 may have a fifth recess 560 connected to the first groove 600a. The fifth recess 560 may be provided in an upper surface of the dummy member 550.

The fifth recess 560 of the dummy member 550 may be formed together when forming the first groove 600a. Processes the same as or similar to the processes described with reference to FIG. 29 may be performed to remove a portion of the molding layer 500 and a portion of the dummy member 550 to form the first groove 600a and the fifth recess 560. The first groove 600a and the fifth recess 560 may form one fifth trench extending between the second semiconductor devices 400. For example, the fifth recess 560 and the first groove 600a may be integrally formed, e.g., in the same process and/or as a continuous one pattern.

Figure 31:
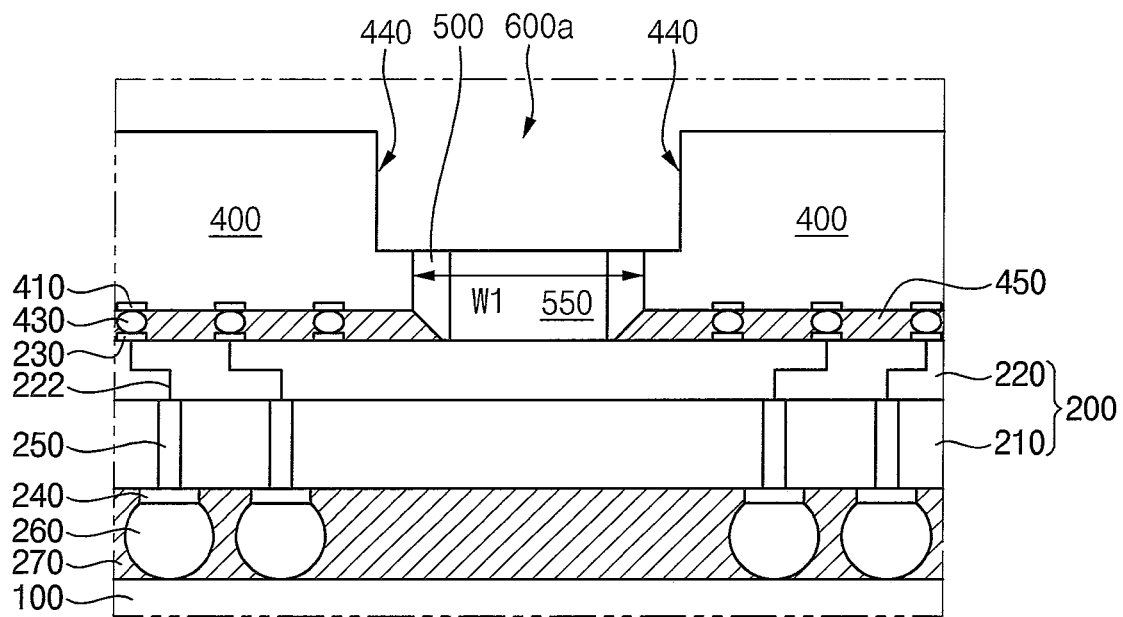

FIG. 31 is a cross-sectional view illustrating a portion of a semiconductor package according to example embodiments. The semiconductor package may be substantially the same as or similar to the semiconductor package described with reference to FIGS. 24 and 25 except for a shape of a groove and a configuration of an additional recess. Thus, same reference numerals will be used to refer to the same or like elements and repetitive explanation concerning the above elements will be omitted.

Referring to FIG. 31, a molding layer 500 may have a first groove 600a extending in a direction between adjacent second semiconductor devices 400. The first groove 600a may be located above a dummy member 550. A first width W1 of the first groove 600a may be equal to a first gap between the second semiconductor devices 400. A side surface of the second semiconductor device 400 may be exposed on a sidewall of the first groove 600a. The dummy member 550 may be exposed on a bottom surface of the first groove 600a.

In example embodiments, the second semiconductor device 400 may have a third recess 440 connected to the first groove 600a. The third recesses 440 may be provided in the side surfaces of the second semiconductor devices 400 opposite to each other. A bottom surface of the third recess 440 may be coplanar with a bottom surface of the first groove 600a.

The third recess 440 of the second semiconductor device 400 may be formed together when forming the first groove 600a. Processes the same as or similar to the processes described with reference to FIG. 29 may be performed to remove a portion of the molding layer 500 and a portion of the second semiconductor device 400 to form the first groove 600a and the third recess 440. The first groove 600a and the third recess 440 may form one third trench extending between the second semiconductor devices 400. For example, the second semiconductor devices 400 on which the third recess 440 is formed may have step structures on the side surfaces. For example, the step structures of the second semiconductor devices 400 may be integrally formed with the first groove 600a.

Figure 32:
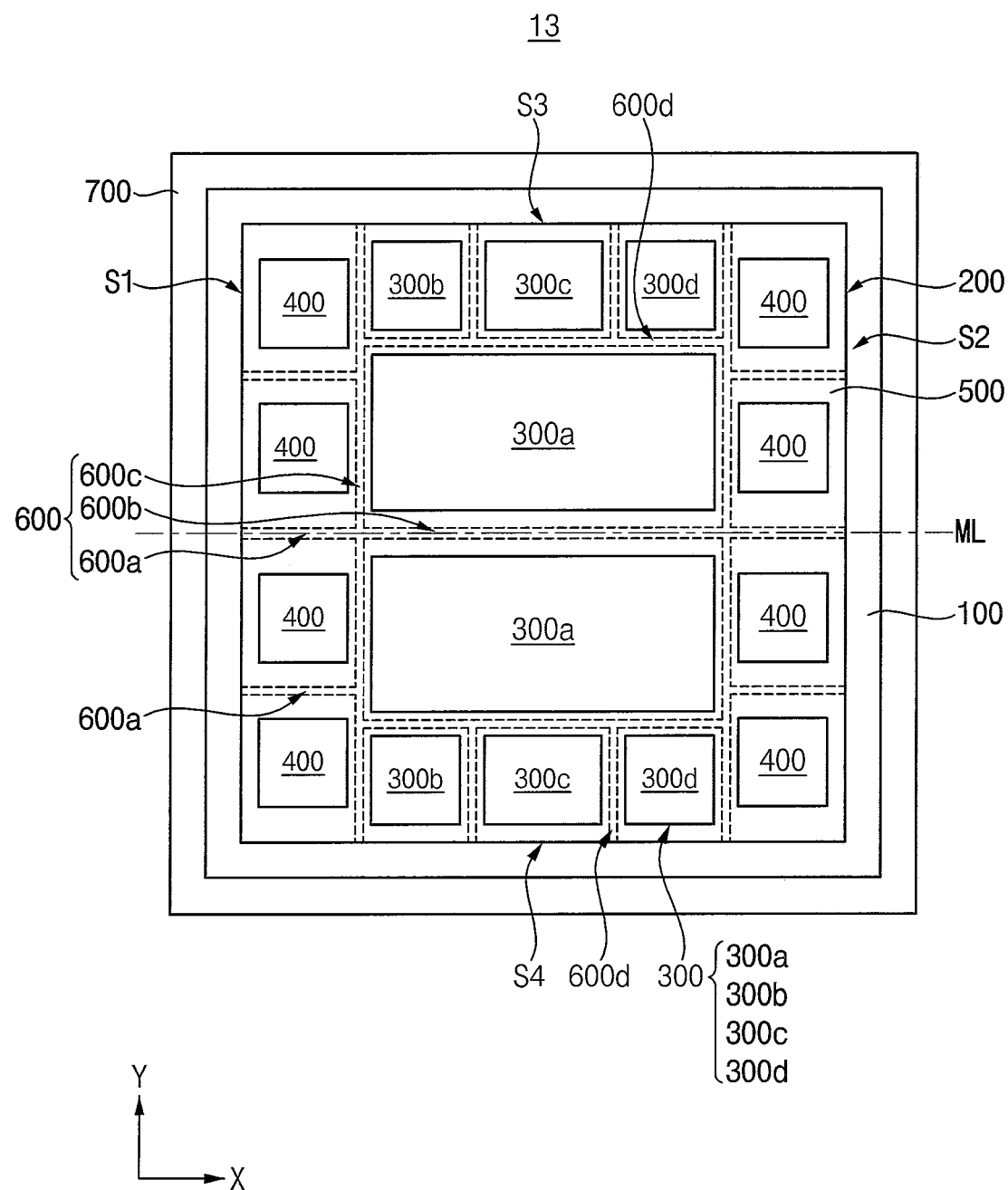

FIG. 32 is a plan view illustrating a semiconductor package according to example embodiments. The semiconductor package may be substantially the same as or similar to the semiconductor package described with reference to FIGS. 1 to 5 except for a configuration of first semiconductor devices 300 and grooves 600 formed between the first semiconductor devices 300. Thus, same reference numerals will be used to refer to the same or like elements and repetitive explanation concerning the above elements will be omitted.

Referring to FIG. 32, a first semiconductor device 300 of a semiconductor package 13 may include a plurality of chiplets 300a, 300b, 300c, and 300d spaced apart from each other, e.g., in horizontal directions. Each of the chiplets 300a, 300b, 300c and 300d may be an integrated circuit block designed to work with other similar chiplets to form one larger semiconductor chip.

In example embodiments, the molding layer 500 may further have a plurality of fourth grooves 600d extending between the chiplets 300a, 300b, 300c, and 300d of the first semiconductor device 300.

The fourth grooves 600d may be arranged in a grid shape to correspond to the arrangement of the chiplets 300a, 300b, 300c, and 300d. The fourth grooves 600d may extend to intersect with and/or be connected to each other. The fourth grooves 600d may extend to intersect with and/or be connected to the third grooves 600c.

The semiconductor packages described above may include or may be semiconductor devices such as logic devices or memory devices. The semiconductor packages may include or may be logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims.

What is claimed is:

1. A semiconductor package, comprising:
a package substrate;
an interposer provided on the package substrate;
a plurality of semiconductor devices on the interposer to be spaced apart from each other, the semiconductor devices being electrically connected to the package substrate through the interposer;
an underfill member disposed between the plurality of semiconductor devices and the interposer;
a molding layer on the interposer covering at least one side surface of each of the semiconductor devices, covering the underfill member, and exposing upper surfaces of the semiconductor devices, the molding layer including at least one groove extending in a direction separating the semiconductor devices; and
a dummy member arranged on the interposer between the semiconductor devices.

2. The semiconductor package of claim 1, wherein the semiconductor devices are spaced apart from each other by a distance in a range of 50 µm m to 150 µm m.

3. The semiconductor package of claim 2, wherein an upper surface of the molding layer is coplanar with the upper surfaces of the semiconductor devices.

4. The semiconductor package of claim 1, wherein a side surface of the semiconductor devices is exposed on a sidewall of the groove.

5. The semiconductor package of claim 4, wherein a recess is provided in the side surface of the semiconductor devices to be in communication with the groove.

6. The semiconductor package of claim 1, wherein the molding layer covers at least a portion of the dummy member.

7. The semiconductor package of claim 1, wherein the groove is located above the dummy member.

8. The semiconductor package of claim 1, wherein the dummy member includes a silicon material.

9. A semiconductor package, comprising:
a package substrate;
an interposer arranged on the package substrate, the interposer having a rectangular plate shape having two long sides and two short sides;
two first semiconductor devices on the interposer and being spaced apart from each other in a first direction parallel with an extending direction of the two long sides with a center line between the two first semiconductor devices passing through midpoints of the two long sides of the rectangular plate shape;
eight second semiconductor devices, arranged on the interposer on opposing sides of the two first semiconductor devices in a second direction, the second semiconductor devices being spaced apart from each other in the first direction on each of the opposing sides;
an underfill member disposed between the two first semiconductor devices and the interposer; and
a molding layer on the interposer covering at least one side surface of each of the first and second semiconductor devices and covering the underfill member, wherein the molding layer includes a first groove extending in a second direction perpendicular to the first direction between the first semiconductor devices and a second groove extending in the second direction between the second semiconductor devices that are spaced apart from each other.

10. The semiconductor package of claim 9, wherein the first groove and the second groove are connected to each other.

11. The semiconductor package of claim 9, further comprising:
a dummy member arranged on the interposer between two of the second semiconductor devices, wherein the molding layer covers at least a portion of the dummy member.

12. The semiconductor package of claim 11, wherein the second groove is located above the dummy member.

13. The semiconductor package of claim 9, wherein the molding layer further includes a third groove extending in the first direction between one of the first semiconductor devices and one of the second semiconductor devices.

14. A semiconductor package, comprising:
a package substrate;
an interposer arranged on the package substrate, the interposer having a rectangular plate shape having opposing first sides and opposing second sides;
first semiconductor devices disposed on the interposer and being spaced apart from each other in a first direction parallel with an extending direction of the opposing first sides;
second semiconductor devices disposed on the interposer and being arranged at opposing sides of the first semiconductor devices in a second direction perpendicular to the first direction, the second semiconductor devices being spaced apart from each other in the first direction;
an underfill member disposed between the first semiconductor devices and the interposer; and
a molding layer on the interposer covering at least one sidewall of each of the first and second semiconductor devices, covering the underfill member, and exposing upper surfaces of the first and second semiconductor devices, wherein the molding layer includes a first groove extending in the second direction between the first semiconductor devices that are spaced apart from each other with a center line of the first groove passing through midpoints of the opposing first sides of the rectangular plate shape, and a second groove extending in the second direction between the second semiconductor devices that are spaced apart from each other with a center of the second groove passing through the midpoints of the opposing first sides of the rectangular plate shape,
wherein the first semiconductor devices are spaced apart from each other in the first direction by a distance within a range of 20 μm to 100 μm, and
wherein the second semiconductor devices are spaced apart from each other in the first direction by a distance within a range of 50 μm to 150 μm.

15. The semiconductor package of claim 14, wherein the first and second semiconductor devices have a first coefficient of thermal expansion, and the molding layer has a second coefficient of thermal expansion greater than the first coefficient of thermal expansion.

16. The semiconductor package of claim 15, wherein the second coefficient of thermal expansion of the molding layer is within a range of 5 ppm/° C. to 15 ppm/° C.

17. The semiconductor package of claim 14, further comprising:
a dummy member arranged on the interposer between the second semiconductor devices, wherein the molding layer covers at least a portion of the dummy member.

18. The semiconductor package of claim 14, wherein the underfill member is a first underfill member, and further comprising:
a second underfill member filled between the interposer and the second semiconductor devices.

* * * * *